United States Patent
Pham et al.

(10) Patent No.: US 10,871,003 B2
(45) Date of Patent: Dec. 22, 2020

(54) POWER POLE SYSTEM

(71) Applicant: SOUTHERN CALIFORNIA EDISON COMPANY, Rosemead, CA (US)

(72) Inventors: Bryan Pham, Rosemead, CA (US); James Palma, Rosemead, CA (US); Viet Quoc Tran, Rosemead, CA (US); Vibhu Kaushik, Rosemead, CA (US)

(73) Assignee: Southern California Edison Company, Rosemead, CA (US)

( * ) Notice: Subject to any disclaimer, the term of this patent is extended or adjusted under 35 U.S.C. 154(b) by 0 days.

(21) Appl. No.: 16/629,189

(22) PCT Filed: Feb. 14, 2019

(86) PCT No.: PCT/US2019/018053
§ 371 (c)(1),
(2) Date: Jan. 7, 2020

(87) PCT Pub. No.: WO2019/161088
PCT Pub. Date: Aug. 22, 2019

(65) Prior Publication Data
US 2020/0370323 A1    Nov. 26, 2020

Related U.S. Application Data

(60) Provisional application No. 62/792,296, filed on Jan. 14, 2019, provisional application No. 62/630,703, filed on Feb. 14, 2018.

(51) Int. Cl.
*E04H 9/02*    (2006.01)
*E04H 12/24*   (2006.01)
(Continued)

(52) U.S. Cl.
CPC ............ *E04H 9/0215* (2020.05); *E04H 12/20* (2013.01); *E04H 12/24* (2013.01); *G01K 1/14* (2013.01);
(Continued)

(58) Field of Classification Search
CPC ....... E04H 9/0215; E04H 12/20; E04H 12/24; G01K 1/14; G01K 11/265; G01L 1/106;
(Continued)

(56) References Cited

U.S. PATENT DOCUMENTS 5,175,971 A * 1/1993 McCombs ............... H02G 7/20
                                                        52/843
5,512,905 A * 4/1996 Nichols .................. G01C 15/06
                                                       33/366.12
(Continued)

FOREIGN PATENT DOCUMENTS

CN      107119961 A    9/2017
CN      208109176 U   11/2018
(Continued)

OTHER PUBLICATIONS

PCT/US2019/18053, International Search Report dated May 1, 2019. 13 pages.

*Primary Examiner* — James M Ference
(74) *Attorney, Agent, or Firm* — Jeffrey G. Sheldon; Katherine B. Sales; Cislo & Thomas LLP

(57) ABSTRACT

An energy transmission system comprising a pole, at least one wire, a sensing system coupled to the pole for monitoring pole temperature, dynamic pole loading, external impact on the pole, vibration of the pole, and wires that are downed, at least one line sensor coupled to the wire and at least one powered data integrator. The sensing system comprises at least one dynamic pole loading sensor and a three-dimensional accelerometer. The dynamic pole loading
(Continued)

sensor can be coupled to the lower portion of the pole above ground level but not more than 10 feet above ground level. Optionally there are two dynamic pole loading sensors, the first sensor having a longitudinal axis parallel to a longitudinal axis of the pole, and the second sensor having a longitudinal axis perpendicular to the longitudinal axis of the pole.

22 Claims, 38 Drawing Sheets

(51) Int. Cl.
*E04H 12/20* (2006.01)
*H02G 7/05* (2006.01)
*G01P 15/18* (2013.01)
*G08B 21/18* (2006.01)
*G01K 1/14* (2006.01)
*G01L 1/10* (2006.01)
*G01P 15/08* (2006.01)
*G01L 5/00* (2006.01)
*G01K 11/26* (2006.01)
*G01R 19/145* (2006.01)

(52) U.S. Cl.
CPC ............ *G01K 11/265* (2013.01); *G01L 1/106* (2013.01); *G01L 5/0052* (2013.01); *G01P 15/08* (2013.01); *G01P 15/18* (2013.01); *G01R 19/145* (2013.01); *G08B 21/182* (2013.01); *H02G 7/05* (2013.01)

(58) Field of Classification Search
CPC ........ G01L 5/0052; G01P 15/08; G01P 15/18; G01R 19/145; G08B 21/182; H02G 7/05
See application file for complete search history.

(56) References Cited

U.S. PATENT DOCUMENTS

| | | | | |
|---|---|---|---|---|
| 6,459,998 | B1* | 10/2002 | Hoffman | H02H 1/0076 340/661 |
| 6,549,120 | B1* | 4/2003 | de Buda | H04B 3/54 370/203 |
| 7,453,352 | B2* | 11/2008 | Kline | G02B 6/483 307/3 |
| 9,441,964 | B2* | 9/2016 | Chery | G01C 9/06 |
| 9,606,164 | B2* | 3/2017 | Wong | G01R 31/088 |
| 2002/0011004 | A1* | 1/2002 | Ashjaee | G01C 9/06 33/366.24 |
| 2009/0027061 | A1* | 1/2009 | Curt | H02J 13/00002 324/539 |
| 2010/0073182 | A1* | 3/2010 | Gori | B60M 1/04 340/668 |
| 2011/0288777 | A1* | 11/2011 | Gupta | G06Q 50/06 702/5 |
| 2012/0146333 | A1* | 6/2012 | Bywaters | F03D 7/0296 290/44 |
| 2014/0278150 | A1* | 9/2014 | Baesler | E04H 12/00 702/34 |
| 2015/0304487 | A1* | 10/2015 | Chaput | F16B 2/10 248/550 |
| 2016/0061603 | A1* | 3/2016 | Phillips | G01C 9/02 33/365 |
| 2016/0209445 | A1* | 7/2016 | McCammon | H02N 2/181 |
| 2018/0100323 | A1* | 4/2018 | Burbank | E04H 12/24 |
| 2018/0375316 | A1* | 12/2018 | Greco | H02G 7/20 |

FOREIGN PATENT DOCUMENTS

| | | |
|---|---|---|
| KR | 101038254 B1 | 5/2011 |
| WO | 2017/125740 A1 | 7/2017 |

* cited by examiner

POWER POLE SYSTEM

CROSS-REFERENCE TO RELATED APPLICATIONS

This application claims the benefit of U.S. Provisional Patent Application No. 62/630,703 filed on Feb. 14, 2018, titled "Power Pole System," and claims the benefit of U.S. Provisional Patent Application No. 62/792,296, filed Jan. 14, 2019, titled "Power Pole System," the contents of both of which are incorporated herein by reference in their entirety.

BACKGROUND

The present invention is directed to an improved power pole system. There is concern that downed power lines can lead to fires. For example there are allegations that fires in Northern California may be associated with downed wires. Therefore there is a need for a system that warns of the potential of power pole failure and actual failure to prevent loss of property and life due to downed power lines.

SUMMARY

In a first embodiment, the present invention is directed to an energy transmission system comprising a power pole having a longitudinal axis and comprising a hollow lower portion having an interior surface, an upper portion coupled to the lower portion, and a cross arm coupled to the upper portion, at least one power wire supported by the cross arm of the pole, a sensing system coupled to the pole for monitoring pole temperature, dynamic pole loading, external impact on the pole, vibration of the pole, and a power wire that is downed, at least one line sensor coupled to the at least one power line for sensing transmission of electricity through the power wire, and at least one powered data receiver.

The sensing system comprises a first dynamic pole loading sensor coupled to the interior surface of the hollow lower portion of the pole, the first dynamic pole loading sensor having a longitudinal axis parallel to the longitudinal axis of the pole, a second dynamic pole loading sensor coupled to the interior surface of the hollow lower portion of the pole, the second dynamic pole loading sensor having a longitudinal axis perpendicular to the longitudinal axis of the pole, and at least one three-dimensional accelerometer coupled to the interior surface of the hollow lower portion of the pole.

In a second embodiment, the present invention is directed to an energy transmission system comprising a pole comprising a lower portion and an upper portion coupled to the lower portion, at least one wire supported by the upper portion of the pole, a sensing system coupled to the lower portion of the pole, at least one line sensor coupled to the at least one wire, and at least one powered data receiver.

The sensing system comprises at least one dynamic pole loading sensor coupled to the lower portion of the pole above ground level but not more than 10 feet above ground level, and at least one three-dimensional accelerometer.

In a third embodiment, the sensing system is coupled to the pole for monitoring pole temperature, dynamic pole loading, external impact on the pole, vibration of the pole, and a wire that is downed, and comprises at least one dynamic pole loading sensor and a first three-dimensional accelerometer.

In all embodiments, the powered data receiver is in communication with the dynamic pole loading sensors, the accelerometer, and the line sensor. Optionally, the powered data receiver is in external communication with a control and data acquisition system.

Optionally, the dynamic pole loading sensors monitor dynamic pole loading, temperature of the pole and power wires that are downed.

Optionally, the first accelerometer monitors vibration of the pole, external impact on the pole, tilt of the pole, and power wires that are downed.

Optionally, the dynamic pole loading sensors are wireless surface acoustic wave sensors.

Optionally, the dynamic pole loading sensors are coupled to the pole between 6 and 10 feet above ground level.

Optionally, the dynamic pole loading sensors put forth an alarm signal when a measured load is determined to be greater than a predetermined set value.

Optionally, the system can further comprise a second three-dimensional accelerometer.

Optionally, the pole is a power pole and the wire is a power wire.

DRAWINGS

These and other features, aspects, and advantages of the present invention will become better understood with regard to the following description, appended claims, and accompanying drawings wherein:

DESCRIPTION

As used herein, the following terms and variations thereof have the meanings given below, unless a different meaning is clearly intended by the context in which such term is used.

The terms "a," "an," and "the" and similar referents used herein are to be construed to cover both the singular and the plural unless their usage in context indicates otherwise.

As used in this disclosure, the term "comprise" and variations of the term, such as "comprising" and "comprises," are not intended to exclude other additives, components, integers ingredients or steps.

Figure 1:
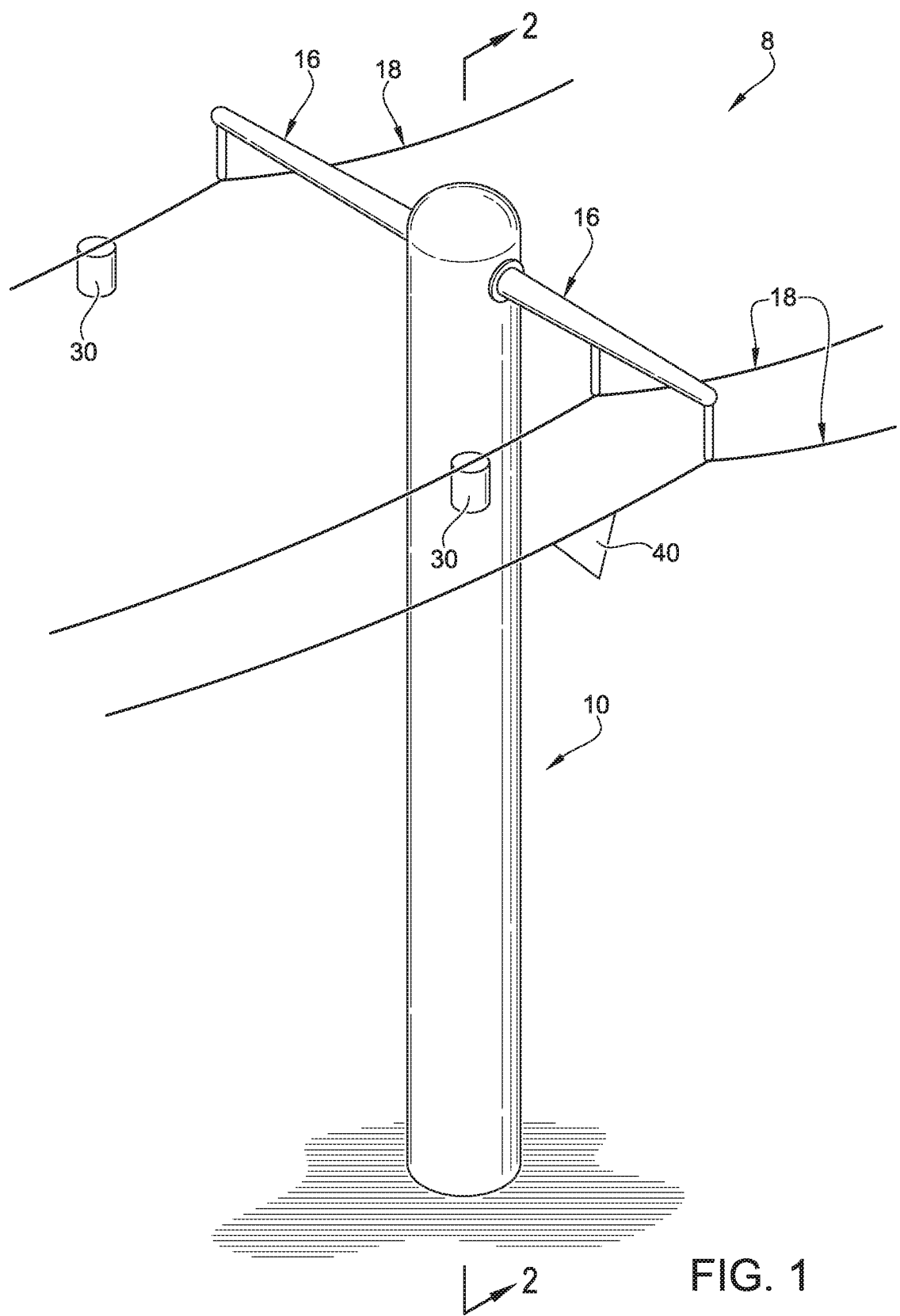
FIG. 1 is a diagram showing an improved power pole system having features of the present invention.
Figure 2:
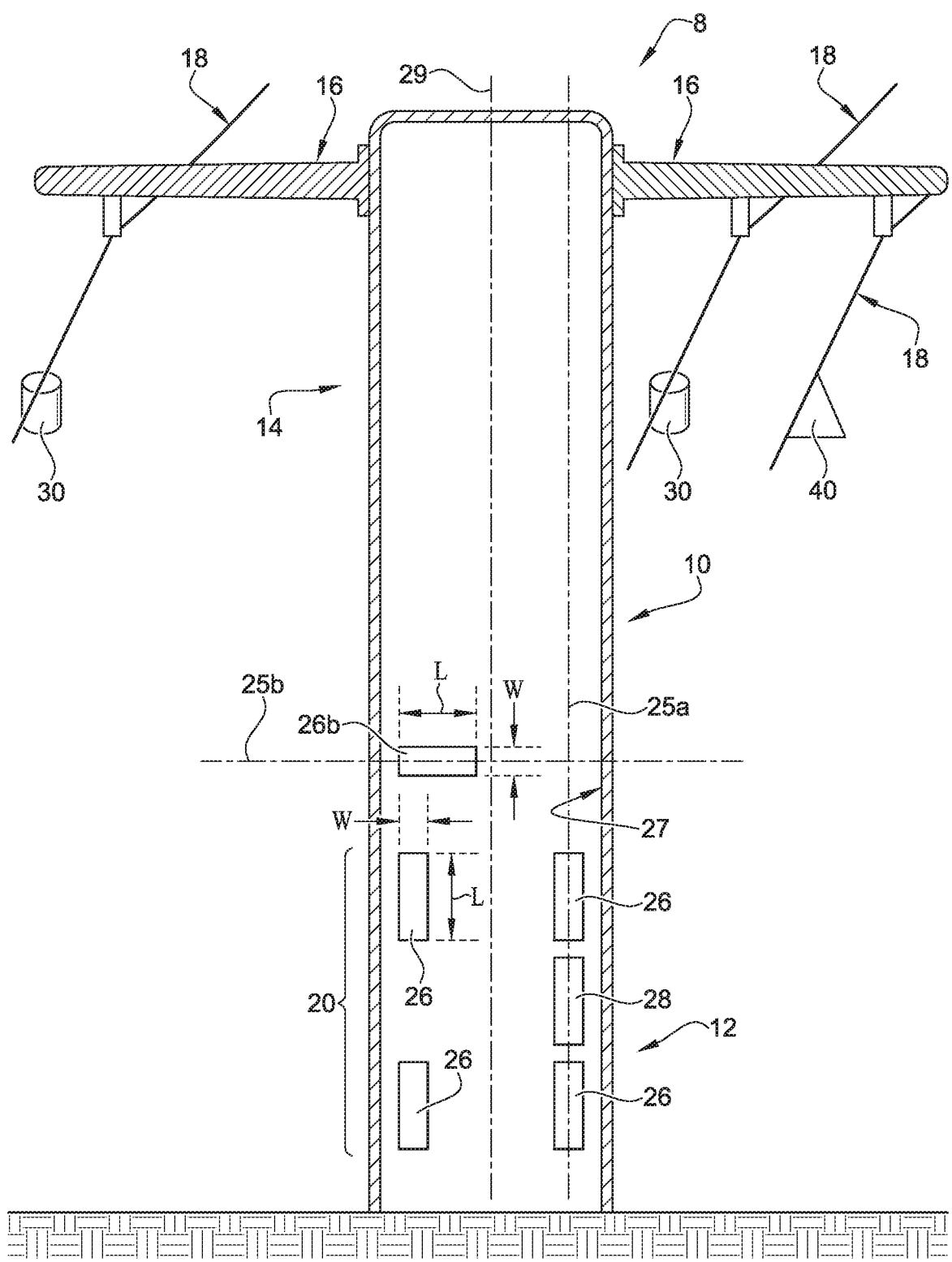
FIG. 2 is a sectional view of the power pole system of FIG. 1, taken along line 2-2.

As shown in FIGS. 1 and 2, the invention is directed to a pole system 8 comprising a pole 10 with a hollow lower portion 12 and a hollow upper portion 14. By the term lower portion 12, it is meant the lower 50% of the length of the pole 10. The pole 10 can be a power pole or a telephone pole and can be made from all steel, all wood, fiberglass, aluminum, concrete, composite material or a hybrid of two or more materials, wherein the lower portion 12 is made from a different material than the upper portion 14 of the pole. If the pole 10 is a hybrid pole, typically the lower portion 12 is steel and the upper portion 14 is composite, usually fiberglass. If the pole 10 is a hybrid pole, the two portions 12, 14 of the pole 10 can be secured together such as by threading a compression fit, with or without fasteners. The system 8 includes a conventional cross arm 16 for supporting electrical wires 18.

Coupled to the pole 10 is a sensing system 20 comprising at least one sensor 26 to monitor strain on the pole and at least one three-dimensional accelerometer 28 to measure tilt and vibration. By three-dimensional it is meant that the accelerometer 28 can monitor X, Y and Z-axis movements. The sensors 26 can also monitor temperature. In FIG. 1 the sensing system 20 (sensors 26 and accelerometer 28) is located inside the pole 10, but that is not necessary. Optionally, both the sensors 26 and the accelerometer 28 can be coupled to the exterior surface of the pole 10 as well. The sensing system 20 monitors one or more of temperature, dynamic pole loading, vibration, external impact, and downed-wires. Monitoring can mean either continuous and/or constant checking, or it can mean intermittent checking.

Optionally, the system 20 can also perform damage assessment and tilt of the pole 10. The sensors 26 can be wireless surface acoustic waves sensors (SAW).

As best seen in FIG. 2, each sensor 26 has a length (L), a width (W) and a longitudinal axis 25 that extends along the length of the sensor. Each pole 10 has a longitudinal axis 29. Typically, the sensors 26 are secured the pole 10 with their longitudinal axis 25a being parallel to the longitudinal axis 29 of the pole 10. Optionally, one or more sensors 26b can be coupled to the pole 10 with their longitudinal axis 25b being perpendicular to the longitudinal axis 29 of the pole 10. The sensors 26 are secured to the inside 27 of the pole 10 with adhesive, such as an epoxy, for long life. Optionally, the sensors 26 can be mounted on a metal platform, or the sensors 26 can be mounted on a ceramic platform. The ceramic platform allows the sensors 26 to withstand higher temperatures due to the lower heat transmission achieved by the ceramic material.

Optionally, temperature and dynamic pole loading can be monitored by one or more SAW strain sensors 26 and external impact and vibration can be monitored by one or more accelerometers 28. The combination of at least one accelerometer 28 and at least one strain sensor 26 allows the system 20 to detect if there is a downed-wire. The use of multiple sensors 26 spaced along the pole 10 allows the system 20 to interpret multiple signature events. And if the system 20 is trained to delineate between different signature events, the system 20 knows when a downed wire occurs, and the power company will know about it even faster.

Additionally, there can be line sensors 30, typically non-powered, on the wires 18, which sense transmission of electricity through the wires 18. The line sensors 30 can also sense voltage, loss of current, temperature and smoke and can also be downed wire sensors that sense fault on a conductor itself. No battery or power is needed. Line sensor 30 can be installed simply by clamping it around a conductor (or power line 18), and powers itself from energy scavenged from electrical or magnetic fields surrounding the conductor being measured. Such line sensors 30 are known in the art.

There is provided a data integrator unit 40 on the line, which communicates with the sensors 26 and line sensors 30. The data integrator 40 is also referred to as a data receiver. The data integrator 40 can optionally be installed on the pole 10. The data integrator 40 uses power either via battery or power directly from the electrical wires 18.

The data integrator 40 receives data from the sensors 26 and the line sensors 30, and can transmit the data to a supervisory control and data acquisition system ("SCADA") or the communication can be two-way that the data integrator 40 receives communications from the SCADA system. The data integrator 40 and the control and data acquisition system are known in the art and can comprise a computing device having a processor and a memory. The data integrator 40 can be either clamped on the wire 18 or mounted on the pole 10. The term "computing device" includes, but is not limited to computers, cellular telephones, hand held computers and other devices that are capable of executing programmed instructions that are contained in a storage including machine readable medium. A memory (or a storage) may represent one or more devices for storing data, including read-only memory (ROM), random access memory (RAM), magnetic disk storage mediums, optical storage mediums, flash memory devices and/or other machine readable mediums for storing information. The term "machine readable medium" includes, but is not limited to portable or fixed storage devices, optical storage devices, wireless channels and various other mediums capable of storing, containing or carrying instruction(s) and/or data.

As noted above, the sensing system 20 performs at least five functions: fire detection, dynamic pole loading (pole strain/tension detection), external impact detection, vibration detection, and downed-wire detection.

As a result of the Examples discussed below, the following features were determined to be advantageous:

Placement of the strain sensor 26 towards the bottom of the pole 10 rather than inside the upper cavity of the pole 10 is advantageous because in the event the pole 10 starts to lean, the strain sensor 26 located at the bottom of the pole 10 alerts a power company early on in the "lean," before the pole 10 actually topples. By the bottom of the pole 10, it is meant that the strain sensor 26 is placed above ground level (0 feet) and 10 feet from ground level, either inside the bottom portion 12 of the pole 10, or coupled to the outside surface of the pole 10 (for example if the pole is a traditional solid wood pole). Preferably, the strain sensor 26 is placed at about 6 feet from ground level, and puts forth an alarm signal when a measured load is determined to be greater than a predetermined set value. This predetermined set value is based on pole strength (which varies depending on the materials the pole is made from, its dimensions, etc.) and will typically be much lower than the maximum load the pole can handle. The predetermined set value can vary, but can be anywhere from 80 pounds/foot to 100,000 pounds/ft. The strain sensor 26 can be used on all steel poles as well, not just hybrid poles.

Optionally, if the first dynamic pole loading/strain sensor 26a is coupled to the pole 10 with its longitudinal axis 25a parallel to the pole's 10 longitudinal axis 29, a second dynamic loading/strain sensor 26b can be coupled to the pole with its longitudinal axis 25b at about a 90° angle to the longitudinal axis 29 of the pole 10. In this case, if the pole 10 falls, the second sensor 26b can continue monitoring the status of the pole 10 after it has fallen. Optionally, the dynamic pole loading sensor 26a, 26b can also detect temperature too; not just stress applied to the pole 10.

Preferably the temperature/fire sensor 26 is located approximately 10 feet above ground level.

The three-dimensional accelerometer 28 measures quick vibration and/or striking of the pole 10. It can also detect if the pole 10 is leaning or falling (tilt) past 30 degrees from its original vertical position.

The strain sensors 26 and accelerometer 28 can be attached to the pole 10 by an adhesive, fasteners such as screws or bolts, or welding. A preferred adhesive is an epoxy. The epoxy used to mount the sensors 26 and accelerometer 28 to the pole 10 can withstand impacts (car-hit-pole, strong wind storms) and high temperatures in excess of 800° F. (fires). Optionally, the sensors 26 and accelerometer 28 can be bolted directly onto threaded holes made in two separate, flat, welded steel pole extensions that are separated by a sufficient distance to accommodate the sensors 26 and accelerometer 28.

The combination of the sensors 26 and the accelerometer 28 (measuring temperature, dynamic pole loading, vibration, external impact and downed-wire) provides a complete suite of features that address many of the major issued faced by power companies today.

Optionally, the system 8 can comprise a separate apparatus for temperature and strain tests to eliminate cross contamination of variables that may influence results spanning multiple tests.

Optionally, the system 8 can comprise optical detectors (either ultra violet or infrared or both) to detect fire at a distance away from the pole 10.

Optionally, the system 8 can comprise software that comprises noise filtering and implements algorithms that allow the software to utilize data and distinguish between scenarios such as type of impact, wire down, windstorm or if a fire is occurring. The system 8 can comprise a processor and computer memory with the software stored in memory, physically located inside a control box mounted on the pole 10.

In order to determine the best placement and achieve optimum function of the sensing system, five tests were performed:
 1. Fire Detection
 2. Dynamic Pole Loading (pole strain/tension detection):
 3. External Impact Detection (car-hit-pole):
 4. Vibration Detection (wind storm, earthquake):
 5. Downed-Wire Detection Test (sudden wire break):

The test results from the above five test cases for the system successfully demonstrated that the system can detect fire (temperature detection), pole stress/tension (dynamic loading), external impact (car-hit-pole), vibration (strong wind, earthquake), damage assessment (fallen or leaning pole), and wire breaks (wire-down). All tests were conducted and data were captured using wireless communications with wired sensors for verification of results.

It was found that all five tests worked successfully on both hybrid pole (steel/composite) and existing all-composite poles. The sensing system also is effective on existing wood poles for Example #1 (fire detection), Example #3 (external impact detection) and Example #4 (vibration detection). It was also determined that adding a remote fault indicator (line sensors) that can detect voltage and current improved the detection of a downed wire.

EXAMPLES

Figure 3:
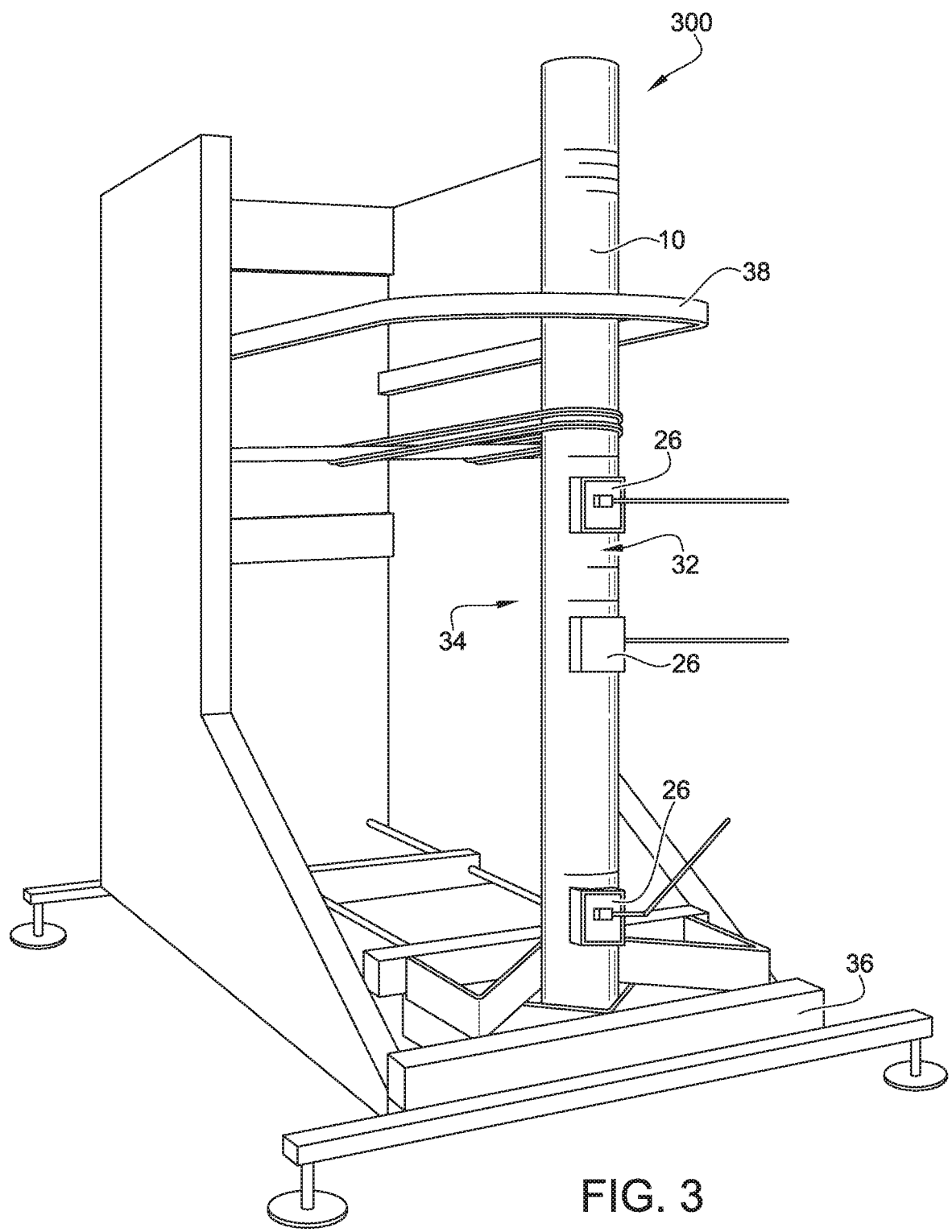
FIG. 3 is a perspective view of a test apparatus used in Examples 1 and 2 presented below, with a pole mounted therein.

Referring now to FIG. 3, for Examples 1 and 2, a test apparatus 300 was set up with at least four (4) SAW strain sensors 26 on each pole, three (3) strain sensors 26 located on front side 32 of the pole 10 and one (or more) strain sensor(s) 26 on a back side 34 of the pole 10, to detect both compression and expansion. Wired conventional strain gages were co-located with each wireless strain sensor 26 to provide reference strain measurements. These strain sensors 26 provided data to detect strains induced in the test pole 10 due to dynamic pole loading. The pole 10 sections tested include 7 foot lengths of a 10" diameter fiberglass pole, a 3" diameter fiberglass pole, a 4" diameter steel pole and a 6" diameter aluminum pole. The 6" diameter aluminum pole was instrumented with a 3-axis accelerometer which was sensitive enough to track minute changes in pole 10 orientation and pole 10 movements in real time.

Examples 1-5 involved four separate poles to demonstrate multiple use cases on different pole materials (composite & steel). As noted above, the first three poles were instrumented with surface acoustic wave (SAW) wireless sensors 26 that detected changes in pole strain and temperature, and wired conventional strain gages provided reference measurements. For Examples 3, 4 and 5, (see the test apparatus shown in FIG. 14) the fourth pole was used and did not have the wireless sensors 26 that were on the first three poles. Instead, it utilized a three-axis accelerometer 28 which was used to detect impact, vibration, and wire down situations. The accelerometer 28 measured the movements the tests induced on the pole and allowed the software to display those motions.

For Examples 1 and 2, each pole was mounted in the test apparatus 300 shown in FIG. 3. The test apparatus 300 provided mechanical support for the pole 10 and had a bottom brace 36 and a top brace 38 to keep the pole 10 from moving out of the test apparatus 300. There were three positions where force could have been applied at 90 degrees to the pole 10. Those positions were at heights of 35.5", 46.25", and 74.25" from a top of the bottom brace 36. Because the force was applied with respect to the top of the bottom brace 36, those force heights were measured from that point. Both wired and wireless sensors 26 were mounted externally on the pole 10 under protective covers. The wired sensors 26 were connected to a National Instruments data acquisition system that sent data directly to the laptop to capture reference measurement data, while the wireless sensors 26 interfaced with an external antenna were connected to a radio that captured data, interpreted the sensor signals, and sent data to the laptop.

Figure 4:
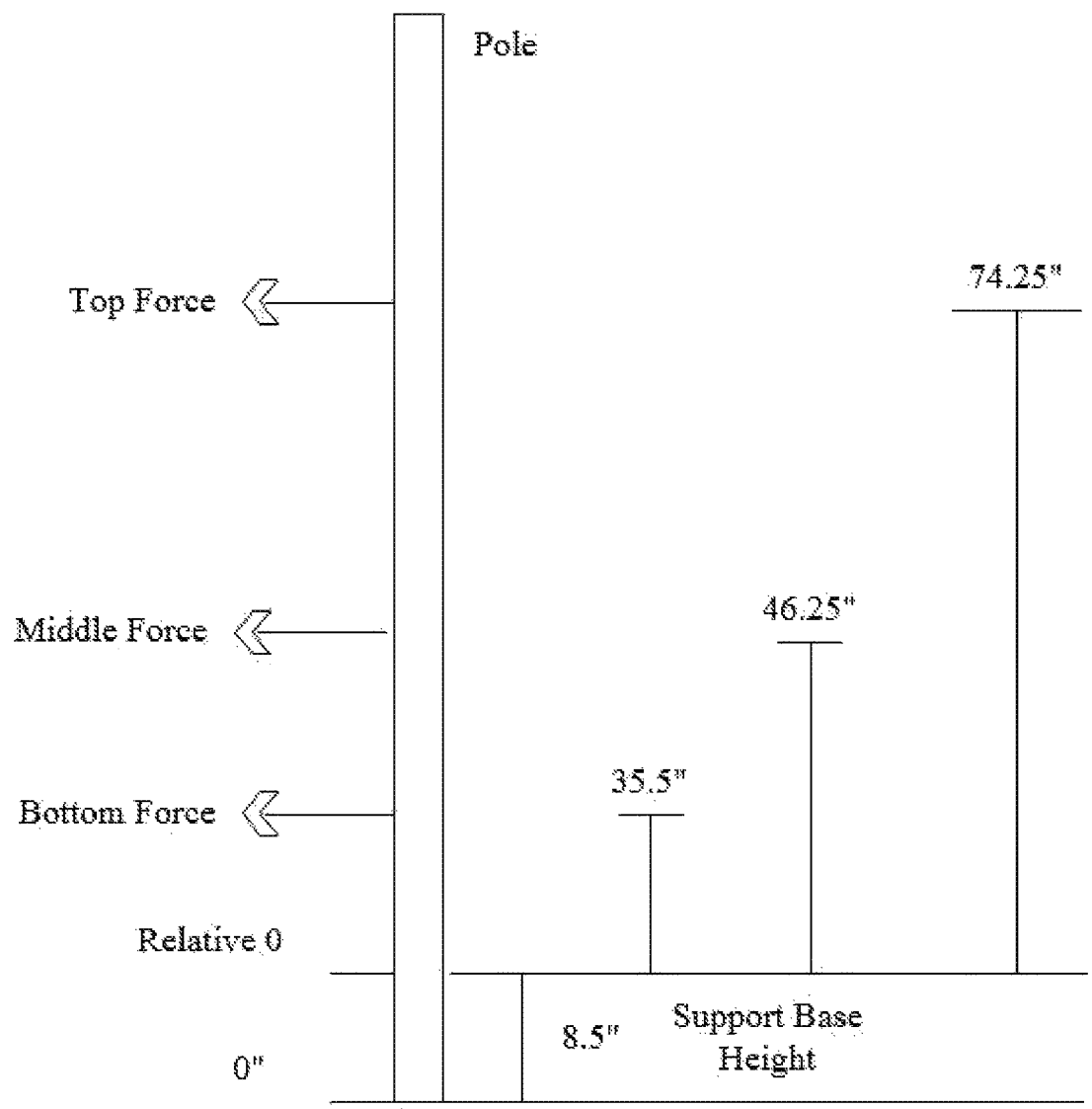
FIG. 4 is a diagram showing the locations of the forces to be applied to the test poles of FIG. 2 during Examples 1 through 5.

One of the components of the tests involved applying a force perpendicular to the longitudinal axis of the pole 10. This force created a bending moment on each pole. The force was applied 8.5" from a bottom of the pole 10 because of the bottom brace 36 that supported the pole 10. The bottom brace 36 height was defined as relative 0 when measuring the height of where the forces were applied. The forces were defined as Top Force, Middle Force, and Bottom Force. This setup can be seen in FIG. 4, which is a diagram of force locations applied during the Examples 1 and 2. Relative 0 is where the top of the bottom brace 36 is.

Calculating theoretical bending moment is analogous to calculating torque as the units are also foot-pounds (lb-ft). The variables for calculating bending moment can be defined as:
 Bending Moment, M (lb-ft)
 Radius of Force to Origin, r (ft)

Applied Force, F (lb)

Angle between r and F, θ (degrees)

Ordinarily, the bending moment involves the cross product of 3-dimensional vectors but for the purpose of these initial tests, the construction of the test rig confined pole motion to one dimension so the bending moment, M was calculated as follows:

$$M = \vec{r} \times \vec{F}$$

The vectors simplify to scalar quantities and a sin θ quantity is introduced to account for the angle between r and F.

$$M = Fr \sin \theta$$

Let θ=90°

$$M = Fr \sin(1)$$

$$M = Fr$$

Using the formula above, values F and r are known so the bending moment can be calculated.

Example 1: Fire Detection

Fires represent a significant threat to power system infrastructure. One of the key benefits of the hybrid power pole system is the ability for real time situational awareness of pole temperature increases that would be characteristic of fire nearby. The objective of this test was to successfully demonstrate the system's ability to accurately and correctly detect pole surface temperature changes.

TABLE 1

LIST OF EQUIPMENT USED FOR
THE FIRE DETECTION TEST

| Name | Model/Serial # | Quantity | Notes |
|---|---|---|---|
| UltraHeat Heat Gun | N/A | 1 | Used to increase ambient temperature around the IMP heat sensor. |

Figure 5:
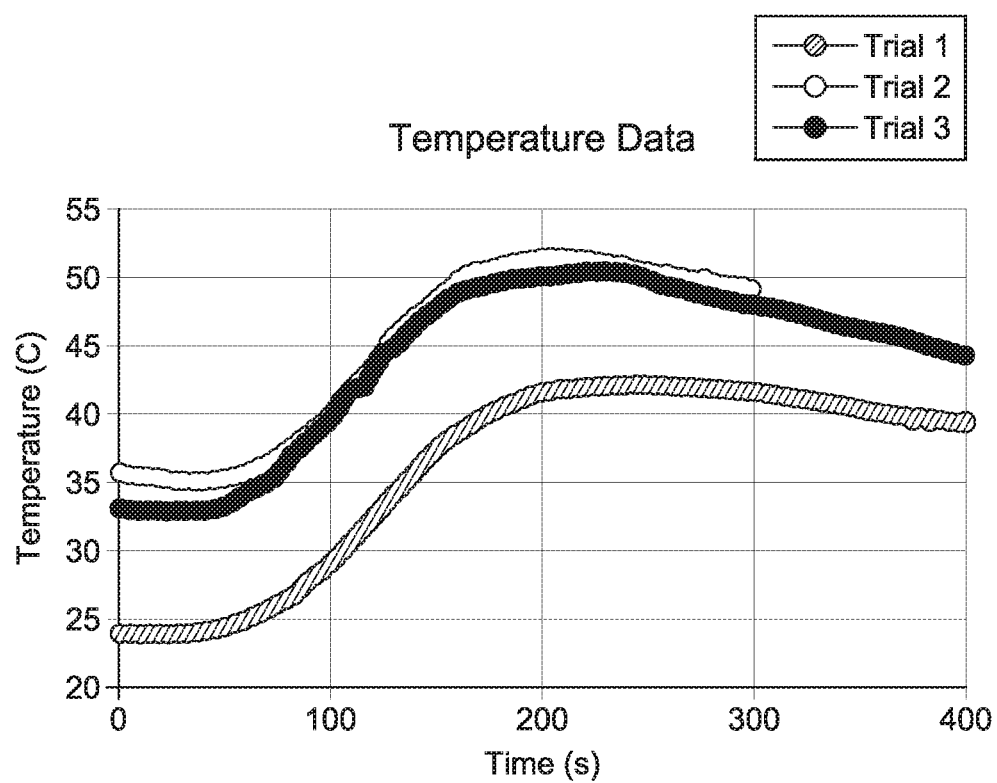
FIG. 5 is graph showing temperature data for all trials in Example 1.

PROCEDURE: A 4" diameter steel pole was mounted into the test apparatus shown in FIG. 3. Next, a heat gun on a high temperature setting was placed in close proximity to middle SAW sensor, sensor number 2. Heat was applied for 90 seconds to avoid epoxy softening. After 90 seconds the heat gun was turned off. The SAW temperature detection measurement (in ° C.) for sensor 2 was recorded until the temperature displayed in the software decreased. FIG. 5 is a graph showing temperature data for all of the trials in Example 1.

FIG. 5 shows that there was consistency in the temperature response provided by the SAW sensors. Trial 1 is labeled 1, trial 2 is labeled 2, and trial 3 is labeled 3. FIG. 5 also shows there was a difference in starting temperatures for trials 2 and 3 because the testing team did not wait for the pole to cool all the way back down to room temperature after conducting trial 1. The test was only applied to the metal pole because the other poles made from different materials would have suffered burns if they had been subjected to the same temperatures for 2 minutes.

TABLE 2

TEMPERATURE DATA FROM TEST

| Pole Type | Trial | Time Heated (s) | SAW Sensor 2 Maximum Temperature Detection Measurement (° C.) |
|---|---|---|---|
| 4" Steel | 1 | 90 | 42.16 |
| 4" Steel | 2 | 90 | 51.47 |
| 4" Steel | 3 | 90 | 50.40 |

CONCLUSION: After conducting temperature tests, it was determined that the sensing system was able to detect changes in ambient temperature. Heat was applied for 1 minute and 30 seconds and the temperature sensors in the sensing system increased in a trend that followed the actual temperature increases. Once heat was turned off the pole temperature increased to a maximum temperature between 42.16 and 50.40 degrees Celsius. Once the pole began to cool, the temperature decreased in a linear fashion. The wireless link quality was good with little electromagnetic interference skewing the data captured by the software. Signal to noise ratio throughout the tests were within acceptable levels reaching a min of 30 dB. Reference temperature readings were taken during testing using an infrared thermometer. Precise reference temperatures at the SAW sensor location were not available using this method. Thus, the accuracy of the SAW temperature sensors could not be verified in these tests.

It was determined that the dynamic pole loading sensor (or SAW sensor) should be coupled to the pole approximately not more than 10 feet above ground level. Preferably, the dynamic pole loading sensor is coupled to the pole approximately 6 feet above ground level.

Example 2: Dynamic Pole Loading

The ability for the pole to detect tension applied to the pole itself was a key capability that formed the backbone for more advanced dynamic loading tests. Strain sensors (SAW sensors) were installed to measure the tension (pole loading) at the point where the sensors were installed. Strain (or engineering strain) was defined as the ratio of the total deformation to the initial dimension of a material object on which forces were applied. In this Example, the extensional strain was the change in length divided by the original length, measured at a particular location. Extensional strain was positive if the material was stretched and negative if it was being compressed.

The idea behind measuring pole loading is that if tension (pole loading) was applied to the pole as a result of electrical conductors or communication wires pulling, or equipment (transformers, switches, etc.) hanging on the pole, the pole would have bent at the direction of load. This bending would have created strain on the pole, causing the pole to 'stretch'. Therefore, it was postulated that placing a strain sensor (which measures the ratio of the difference in length (ΔL) to the original length (L) of the material when it is relaxed, ΔL/L), along the surface of the pole should have a linear correlation to the force on a pole. According to computer simulation performed on this experiment by SenSanna (but scaled to a 65 ft pole) the maximum strain at the base of the pole (as determined by the measured displacement) should have been in the order of 3-5 milli-strains.

Figure 6:
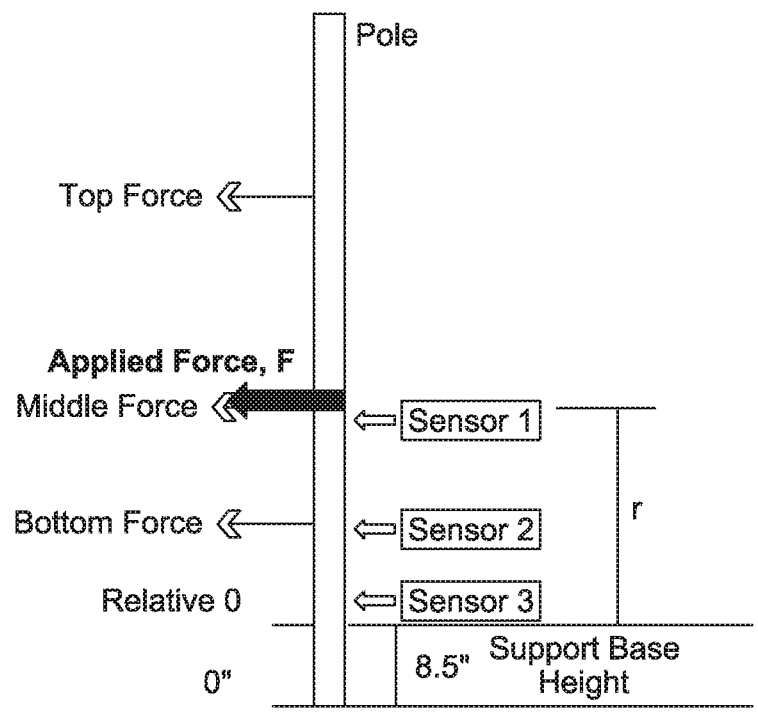
FIG. 6 is a diagram showing the locations of the surface acoustic wave (SAW) strain sensors relative to the locations of the applied forces of Example 2 described below.

In this test, as shown in FIG. 6, tension was applied at the location labeled 'Middle Force' on the pole which created a bending moment at the base of the pole. The collection of sensors, labeled Sensors 1-3 on FIG. 6, were able to detect the strain caused by the force applied, as shown by the arrow labeled Applied Force, F. A load cell sensor which measures the applied force, F, on the pole provided the actual bending moment when multiplied with the height, r, to base.

$M = \vec{r} \times \vec{F}$, bending moment.

Data collected from the resistive sensors and the SAW sensors helped to validate that the strain/tension on the pole were correctly measured. FIG. 6 shows the locations of the SAW strain sensors relative to the location of the applied force.

Both wireless SAW sensors and hardwired resistive strain sensors were installed to validate the accuracy of the wireless strain sensors. The SAW strain sensors and the resistive strain sensors measured the relative elongation (strain) or compression (tension) on the surface of the pole. Thus, with the help of reference devices such as the load cell and the resistive strain sensors, a standard linear co-efficient of conversion from unitless strain, 'e', to 'lb-ft' was obtained.

TABLE 3

EQUIPMENT LIST FOR THE TENSION TEST

| Name | Model/Serial # | Quantity | Notes |
|---|---|---|---|
| Tension Load Cell | N/A | 1 | Used to precisely apply tension to the pole. |

PROCEDURE: First, a 10" diameter fiberglass pole was set up in the test apparatus shown in FIG. 3. Next, it was confirmed that the bending moment on the pole was set at 0 lb-ft, so that the bending moment was set at 0 lb-ft where the force was applied. Then, the monitoring software was started and left for 100 seconds to establish a baseline. Once the baseline was established, bending moment was increased to 500 lb-ft (or 2000 lb-ft, for the 8" diameter fiberglass pole) for 400 seconds, which was a force of 130 lb. (or 568 lb., for the 8" diameter fiberglass pole) applied at the 'Middle Force' section. Then the tension was lowered back to 0 lb-ft for 200 seconds. Three trials were conducted like this. Then the test was ended and the steps above were repeated for a 4" diameter steel pole, except that tension was applied at 500 lb-ft.

OBSERVATIONS AND DATA: In the first test with the 4" diameter steel pole, the data obtained were summarized in the graphs shown in FIGS. 7a-7c. In the first graph, FIG. 7a, a baseline measurement was obtained by applying a force of 130 lb on the 'Middle Force' section to provide a value around ~500 lb-ft at the base. To validate the measurement, the value when back calculated with the formula, provided the following:

$$F_{applied} = \frac{M_{bending\ moment}}{r_{force\ height}} = \frac{500\ lb.ft}{46.25\ inch} \times \frac{12\ inch}{1\ ft} = 129.7\ lb,$$

therefore, validating the force applied.

Figure 7A:
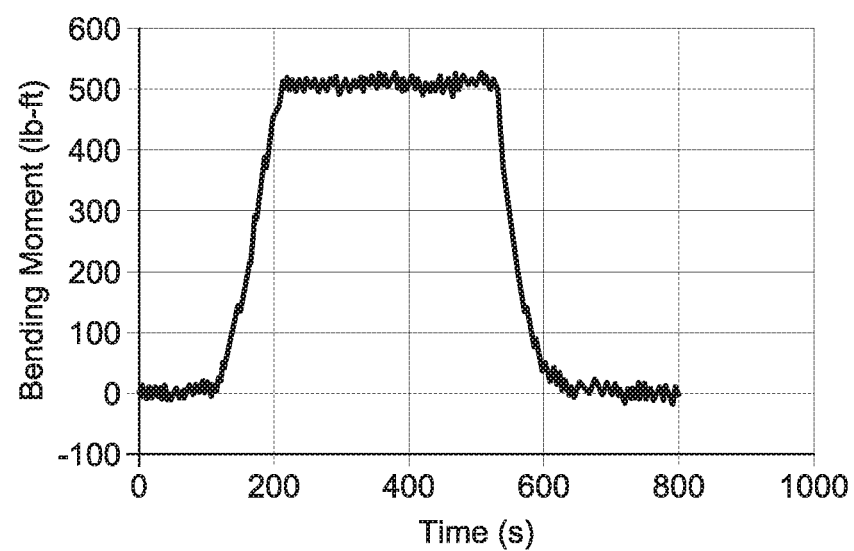
FIG. 7a is a graph showing the force applied to a 4" diameter steel pole tested in Example 2.
Figure 7B:
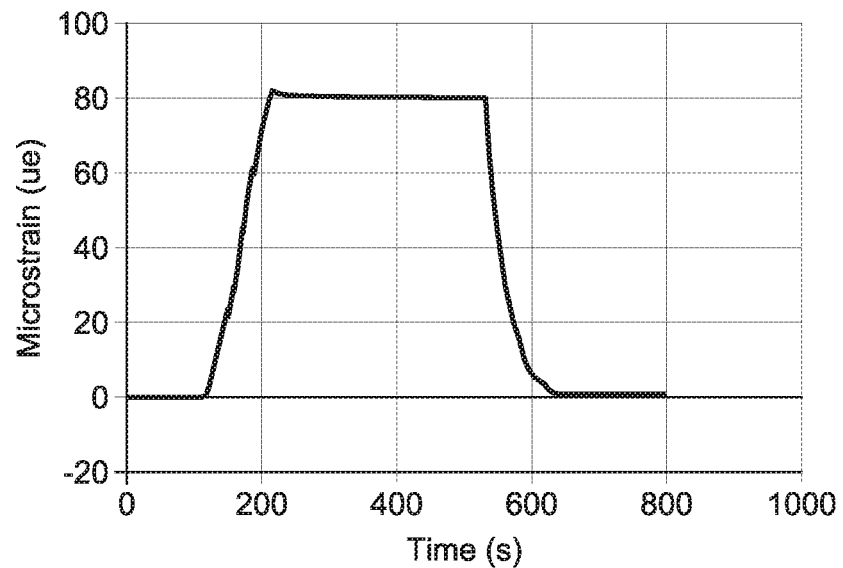
FIG. 7b is a graph showing the force applied to the 4" diameter steel pole and the sensing of a hardwired resistive gage 2 sensor, tested in Example 2.
Figure 7C:
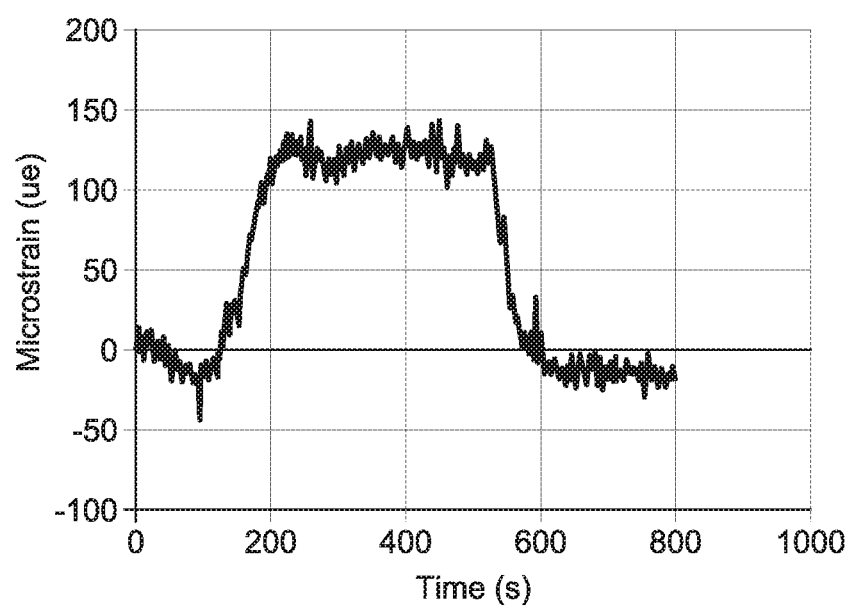
FIG. 7c is a graph showing the force applied to the 4" diameter steel pole and the sensing of a wireless SAW sensor 2, tested in Example 2.

In FIG. 7a, the graph shows the calculated bending moment at the pole base with an applied force of 130 lb at 'Middle Force' section. The distance from the applied force to the pole base was 46.25 inches or 3.85 ft which provided the calculated bending moment of 500.5 lb-ft (130 lb×3.85 ft=500.5 lb-ft). FIGS. 7b and 7c show the strain gage measurements at Sensor 2, where FIG. 7b shows the hardwired sensor and FIG. 7c shows the wireless SAW sensor. Since the strain gage measured the displacement over a length, it was observed that the strain graph correlated to the bending moment even though they were calculated at different locations on the pole. This demonstrated that the strain measurement could be correlated to the actual bending moment in lb-ft at various locations on the pole.

Figure 8A:
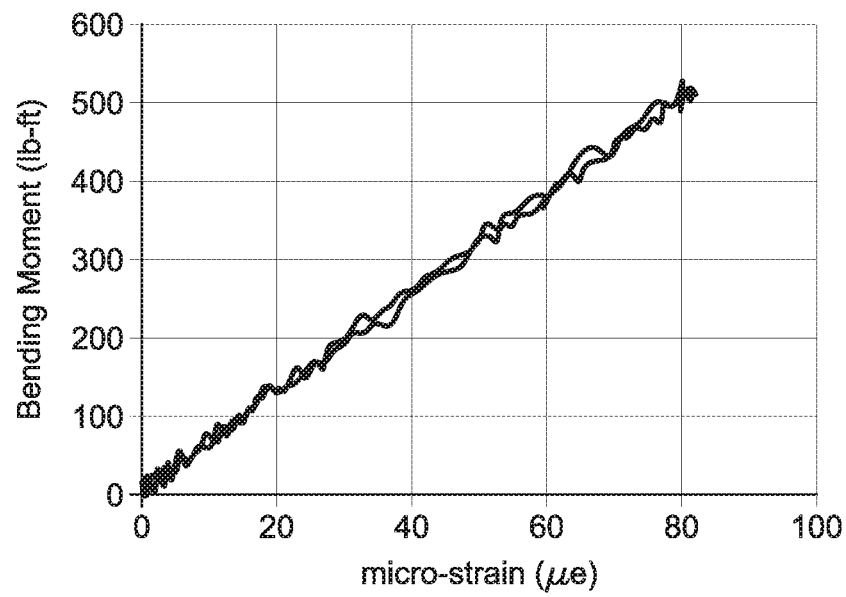
FIG. 8a is a graph showing a linear hysteresis relationship between the hardwired strain sensor and the actual bending moments shown by the 4" diameter steel pole tested in Example 2.
Figure 8B:
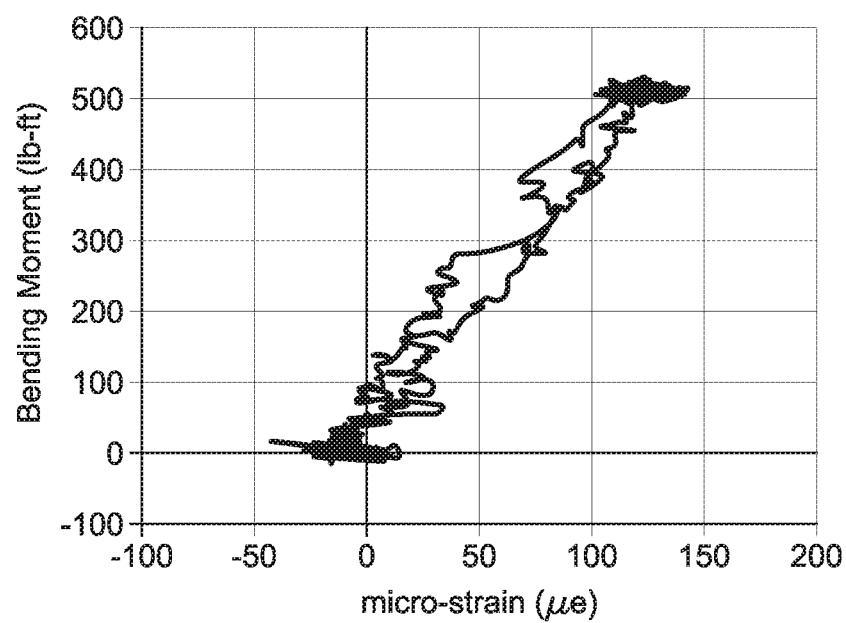
FIG. 8b is a graph showing the linear hysteresis relationship between the wireless strain sensor and the actual bending moments show by the 4" diameter steel pole tested in Example 2.
Figure 9A:
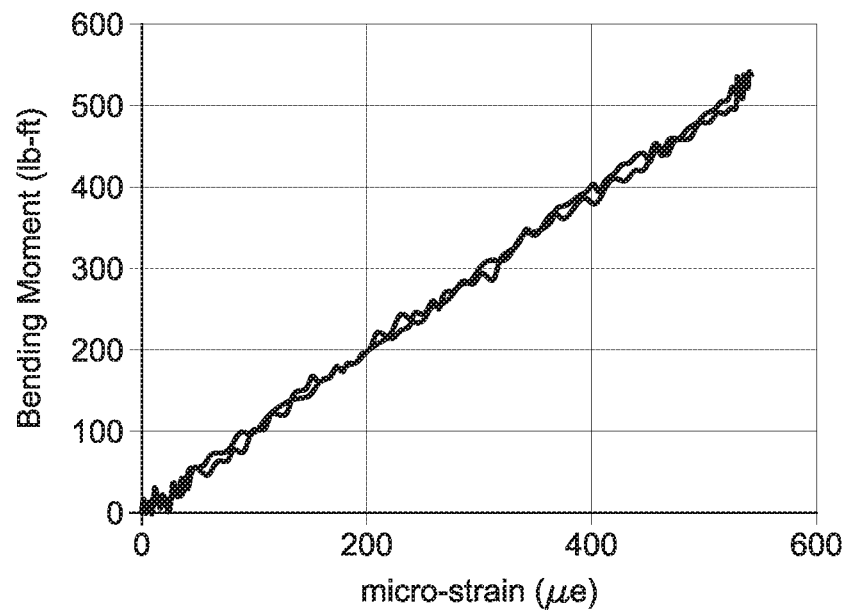
FIG. 9a is a graph showing the linear hysteresis relationship between a hardwired strain sensor and the actual bending moments shown by a 3" diameter fiberglass pole tested in Example 2.
Figure 9B:
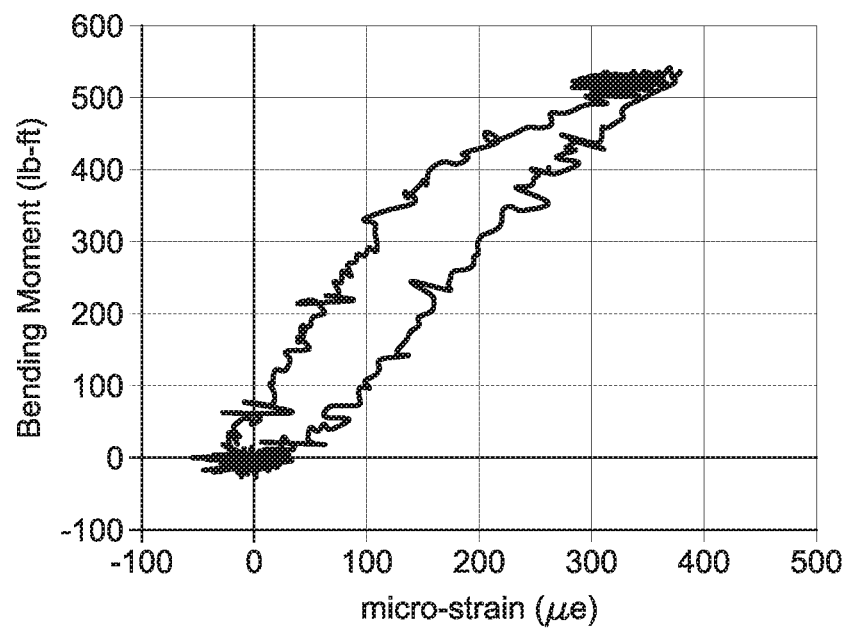
FIG. 9b is a graph showing the linear hysteresis relationship between a wireless strain sensor and the actual bending moments shown by the 3" diameter fiberglass pole tested in Example 2.

In the graphs of FIGS. 8a and 8b, the relation between microstrain (ue) and bending moment (lb-ft) exhibited a linear hysteresis plot due to the relaxation and tensioning of the epoxy between the pole surface and the gage. FIG. 8a shows the hardwired sensor and FIG. 8b shows the wireless SAW sensor. Furthermore, it was observed that the in-band 915-928 MHz noise from other devices in the lab negatively impacted the hysteresis curve due to bad Signal to Noise Ratio (SNR) during moments of communications. This should not have an impact to the field implementation due to the less noisy radio environment as compared to the lab. FIGS. 9a and 9b (hardwired sensor and wireless SAW sensor, respectively) show the same correlation hysteresis curves from the 3" diameter fiberglass pole.

Figure 10A:
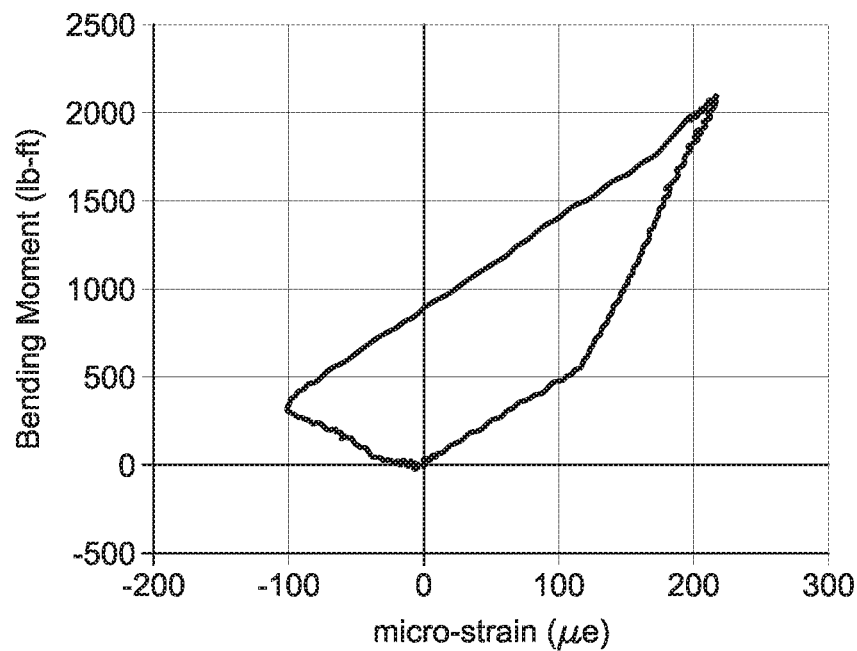
FIG. 10a is a graph showing the linear hysteresis relationship between a hardwired strain sensor and the actual bending moments shown by an 8" diameter fiberglass pole, tested in Example 2.
Figure 10B:
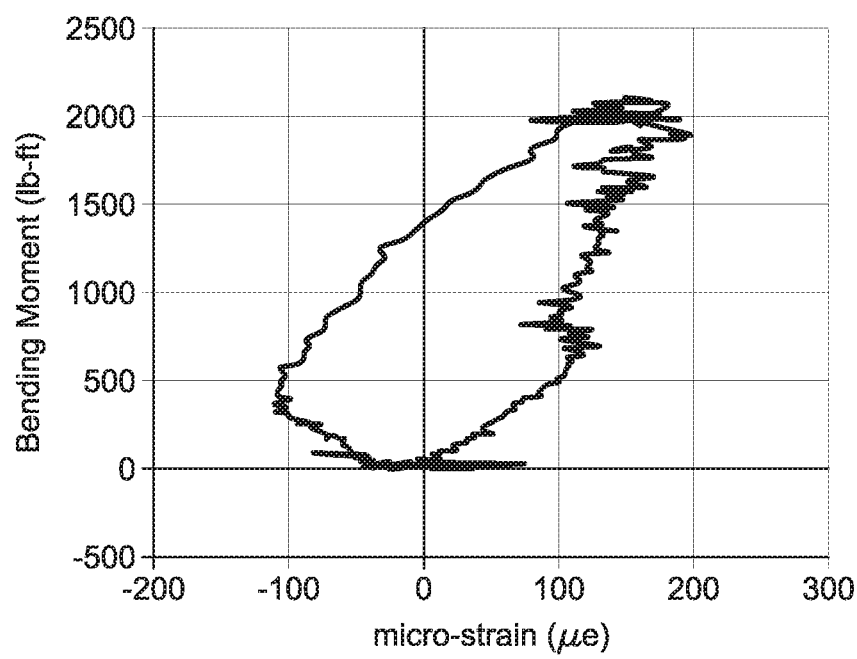
FIG. 10b is a graph showing the linear hysteresis relationship between a wireless strain sensor and the actual bending moments shown by the 8" diameter fiberglass pole tested in Example 2.

In FIGS. 10a and 10b, it was observed that a larger diameter pole (8" diameter fiberglass pole) was more resistant to strain. A bending moment over 2000 lb-ft was required to properly show the displacement needed to create a correlation curve. There were also signs of greater relaxation in the epoxy used for bonding, evident in the way the curve goes to the negative region after force was slowly removed before dropping back to 0. FIGS. 10a and 10b (hardwired sensor and wireless SAW sensor, respectively) show the linear hysteresis relationship between the strain sensors and the actual bending moments shown by the 8" diameter fiberglass pole.

TABLE 5

MAX STRAIN DATA CAPTURED FROM TENSION DETECTION TESTS

| Pole Type | Trial | Theoretical Tension (ft-lb) | Max Experimental Tension (ft-lb) | Max Wired Resistive Strain (ue) | Wireless SAW Strain (ue) |
|---|---|---|---|---|---|
| 3" Fiberglass | 1 | 500 | 496.9 | 509.7 | 341.6 |
| 3" Fiberglass | 2 | 500 | 498.2 | 486.6 | 302.7 |
| 3" Fiberglass | 3 | 500 | 495.1 | 488.1 | 282.4 |
| 4" Steel | 1 | 500 | 500.9 | 216.9 | 78.9 |
| 4" Steel | 2 | 500 | 502.1 | 217.2 | 83.7 |
| 4" Steel | 3 | 500 | 498.2 | 208.4 | 78.9 |
| 10" Fiberglass | 1 | 2,000 | 1,982.3 | 198.3 | 141.5 |
| 10" Fiberglass | 2 | 2,000 | 2,000.3 | 212.5 | 184.2 |
| 10" Fiberglass | 3 | 2,000 | 1,992.8 | 215.3 | 167.1 |

CONCLUSION: After conducting this test, it was concluded the SAW sensor technology implemented in the sensing system could successfully detect the strain resulting from tension applied to the pole. Strain data was collected from both the wired resistive strain gages and the wireless SAW strain gages. When tension was increased, the measured strain increased in both sensors. Looking at the graphs, the general shape between both hardwired and wireless sensors mirrored each other demonstrating the operation of the SAW sensor. The accuracy of the SAW sensors was close to the actual applied stress (with some calibration and when placed in a less in-band noise environment). In its current iteration, it was determined that the SAW sensors demonstrated correlations between strains and bending moment on the pole which may be used for dynamic loading analysis.

Preferably, the SAW sensor should be placed close to the bottom of the pole, with a threshold set much lower than the maximum. This way, an alert will be triggered before the pole actually topples. The threshold can vary, but can be anywhere from 80 pounds/foot to 100,000 pounds/ft.

Example 3: External Impact Detection

Utility poles are constantly under threat of large external impacts from a wide range of external sources. These sources can come from collisions with vehicles and other environmental debris. The accelerometer sensors of the sensing system were capable of detecting large, sudden impacts on the pole. This data allowed the power company to determine if a pole is damaged or down. The purpose of this test was to demonstrate the sensing system's ability to sense impacts and pole tilt.

Accelerometers are electromechanical devices that sense either static or dynamic forces of acceleration. Static forces include gravity, while dynamic forces can include vibrations and movement. Accelerometers measure in meters per second squared (m/s2) or in G-forces (g). The test apparatus used 3-axis accelerometers which measured acceleration in three dimensional planes X Y Z, and when plotted versus time, allowed the sensing of vibrations and orientation changes.

TABLE 6

LIST OF EQUIPMENT USED FOR EXTERNAL IMPACT TEST

| Name | Model/Serial # | Quantity | Notes |
|---|---|---|---|
| Sledgehammer | N/A | 1 | Used to simulate an external impact. |
| Accelerometer | Arduino Unit | 1 | Used to measure impacts. |

Figure 11:
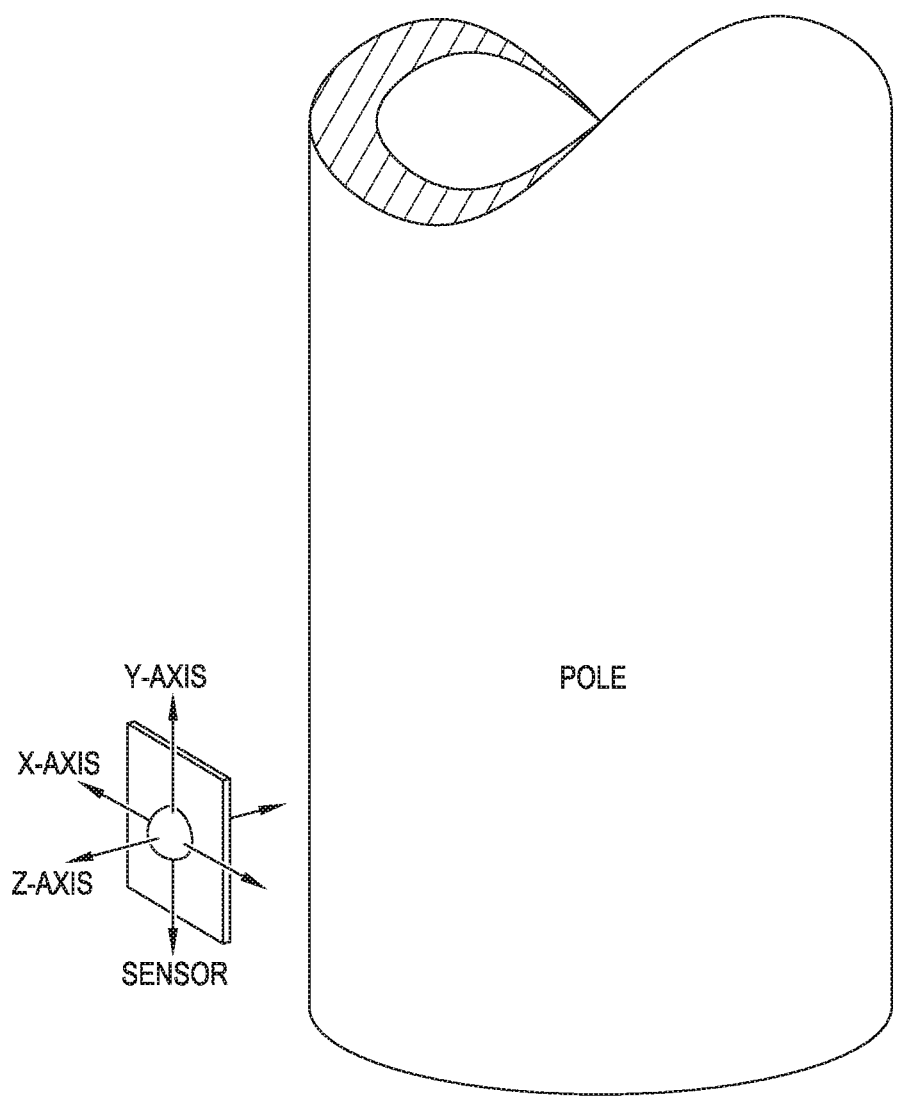
FIG. 11 is a diagram showing a 3-axis accelerometer on a 6" diameter aluminum pole tested in Example 3.

FIG. 11 is a diagram showing how the accelerometer is attached to the 6" diameter aluminum pole, in relation to the X, Y, and Z axes of the pole.

Figure 12:
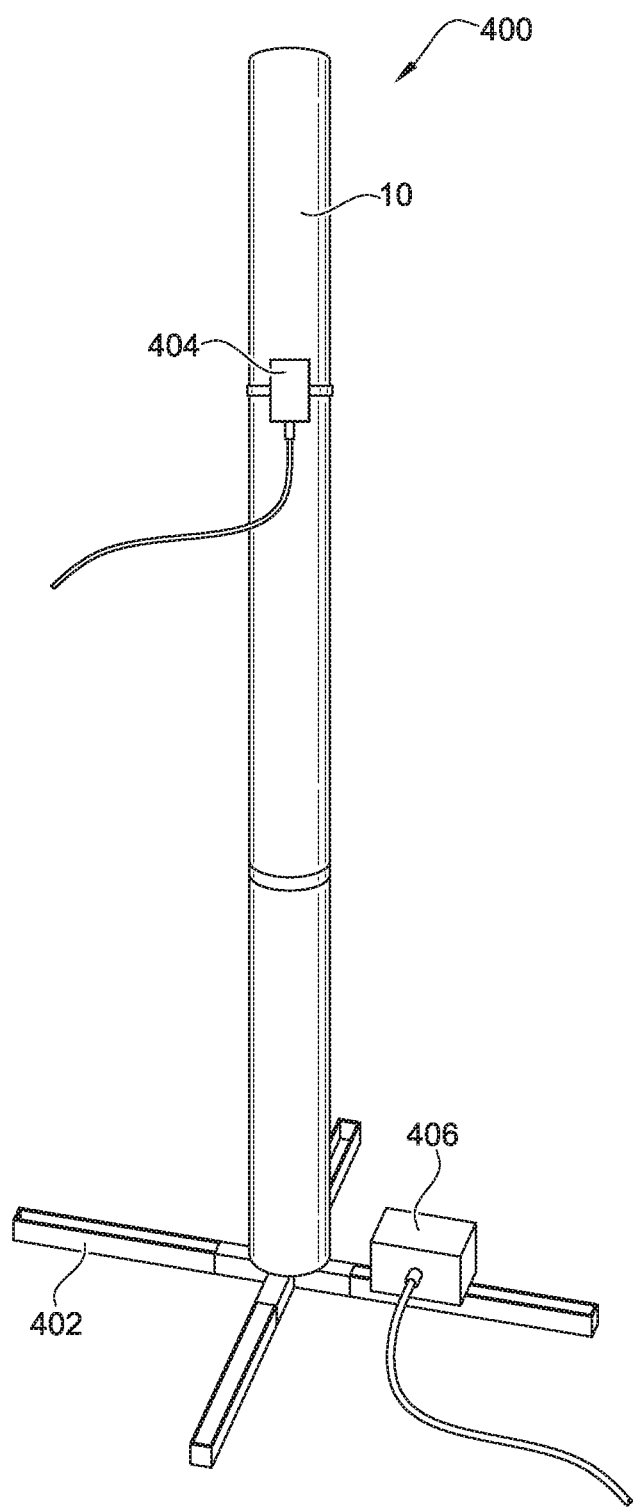
FIG. 12 is a perspective view of a test apparatus used in Examples 3-5, with a representative pole mounted therein, and an accelerometer and a frequency controlled vibrator mounted on the pole.
Figure 13:
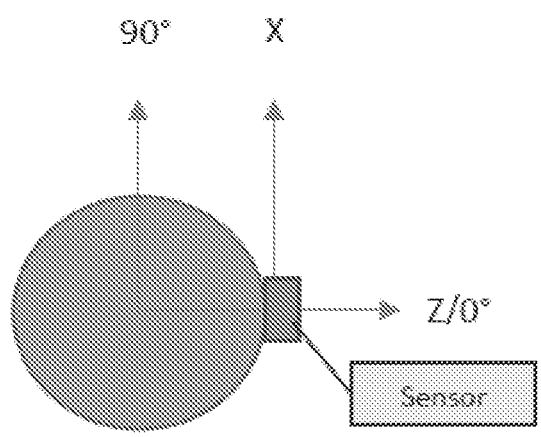
FIG. 13 is a diagram of a top plan view of the of test apparatus of FIG. 12, wherein the relationship between the direction of the X and Z axes with respect to the accelerometer and a hit angle is shown.

PROCEDURE: For the first test, the 6" diameter aluminum pole and impact apparatus were set up in a test apparatus 400 shown in FIG. 12. A pole 10 was set up on a base 402 with an accelerometer 404 coupled to the pole 10 and a vibration motor 406 coupled to the base 402. The mass of a sledgehammer was then measured. After waiting 10 seconds, the pole 10 was hit with the sledgehammer at a 0 degrees hit angle with respect to the horizontal plane (x-axis), at 31 inches above the base 402. FIG. 13 is a top view of the pole 10 and the direction of the X and Z axes with respect to the accelerometer and the hit angle. After waiting 20 seconds between hits, the hits were repeated two additional times.

For the second test, the first test was repeated, adding 45 degrees to the orientation of impact of the hammer to the pole until the degree from the start reached 315 degrees, for a total of eight (8) trials. This provided data on impacts applied to the pole every 45 degrees around the circumference of the pole.

Figure 14:
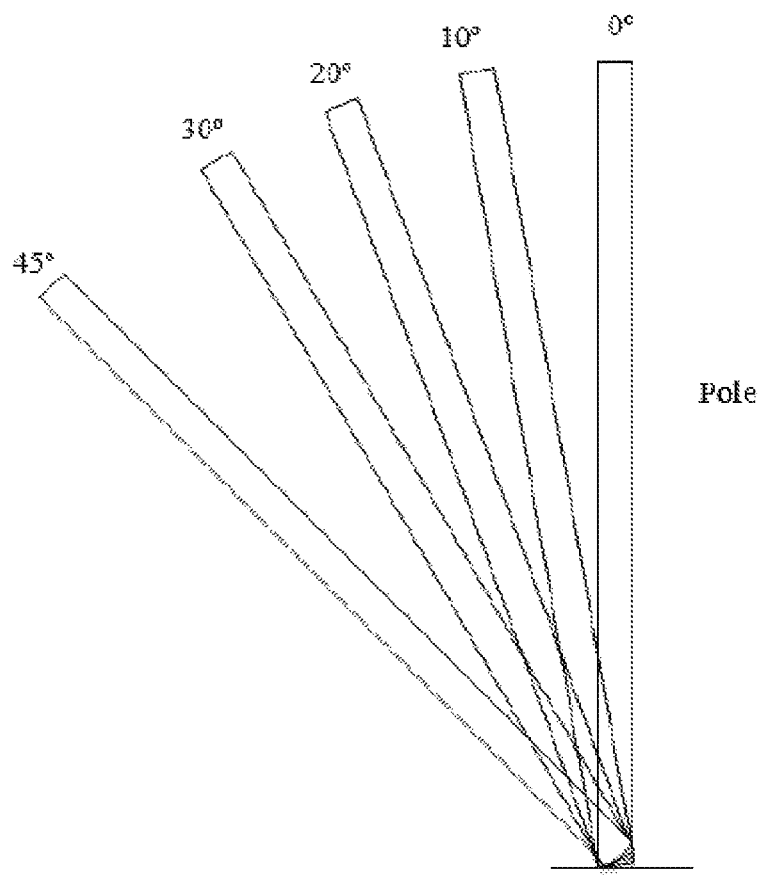
FIG. 14 is a diagram of a 6" diameter aluminum pole leaning during Example 3.

For the third test, the pole was leaned to 10°, 20° and 45° to show the ability of the accelerometer to be aware of a pole leaning. FIG. 14 is a diagram of the 6" diameter aluminum pole, leaning to various degrees.

Figure 15:
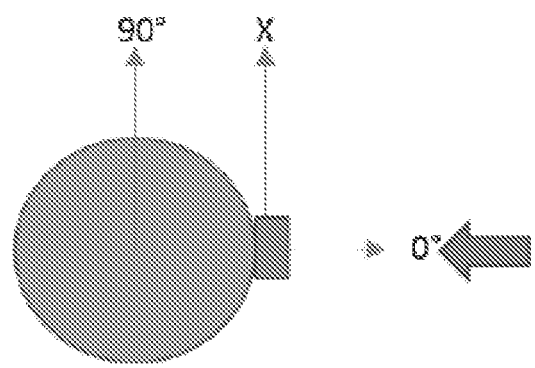
FIG. 15 is a diagram showing an impact area on the 6" diameter aluminum pole tested in Example 3, wherein the impact area is 31" from a bottom of the pole at 0°, indicated with the arrow.

Observations and Data:

FIG. 15 is a diagram showing an impact area on the 6" diameter aluminum pole, where the impact area is 31" from the bottom of the pole at 0°, indicated with the arrow.

Figure 16:
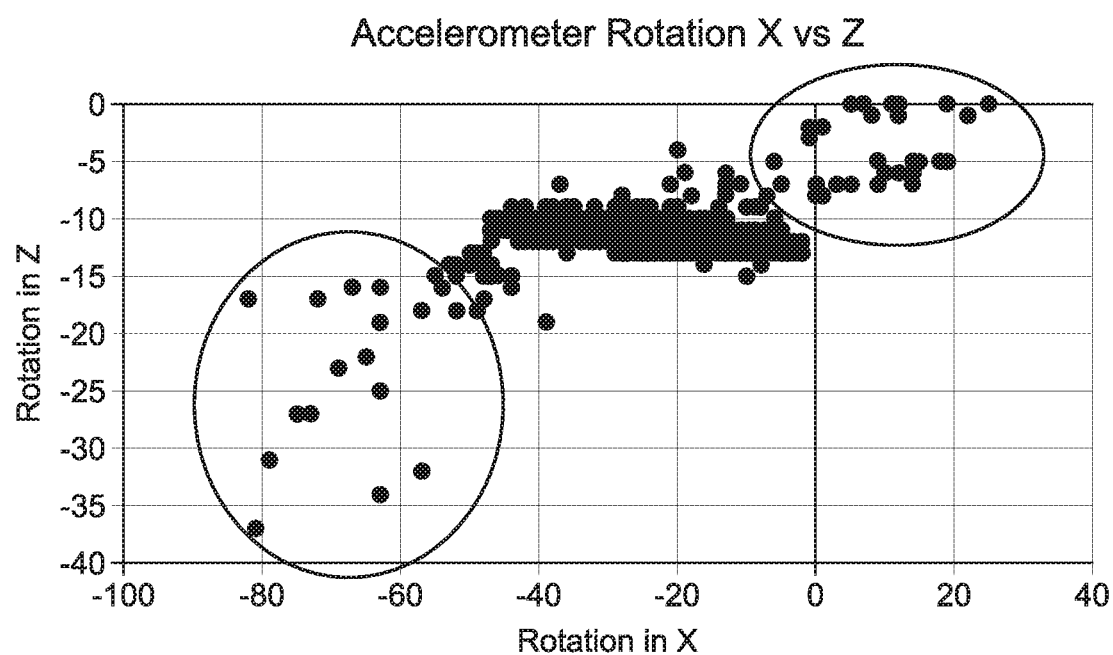
FIG. 16 is a graph showing relative rotation of the 6" diameter aluminum pole during Example 3, wherein the rotation of the pole appears on the X and Z axis of the pole upon hitting the pole at a 0° angle with a hammer, the circles indicating a slight angle when the hammer hit the pole causing large off angle deflections.

FIG. 16 is a graph showing the relative rotation of the 6" diameter aluminum pole, where the rotation of the pole appears on the X and Z axis of the pole upon hitting the pole at a 0° angle with a hammer. The circles indicate a slight angle when the hammer hit the pole causing large off angle deflections.

Figure 17:
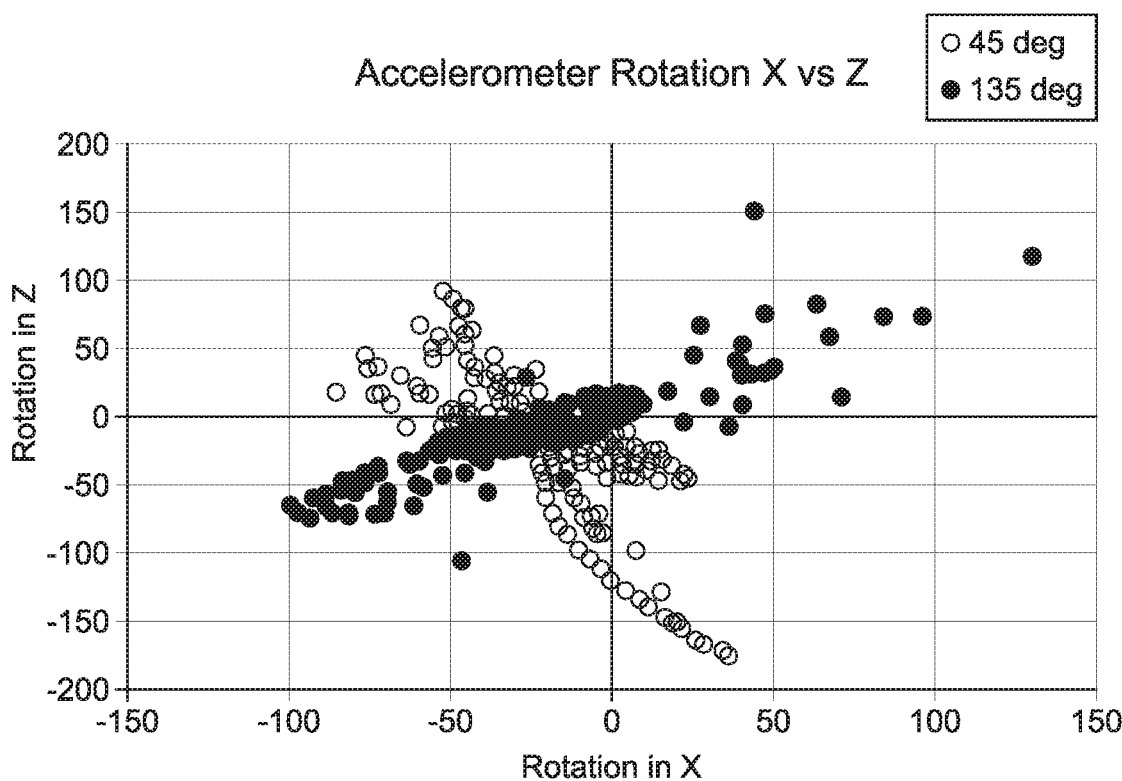
FIG. 17 is a graph showing impact data of the 6" diameter aluminum pole tested in Example 3, when the pole was hit at 45° and 135°.
Figure 18:
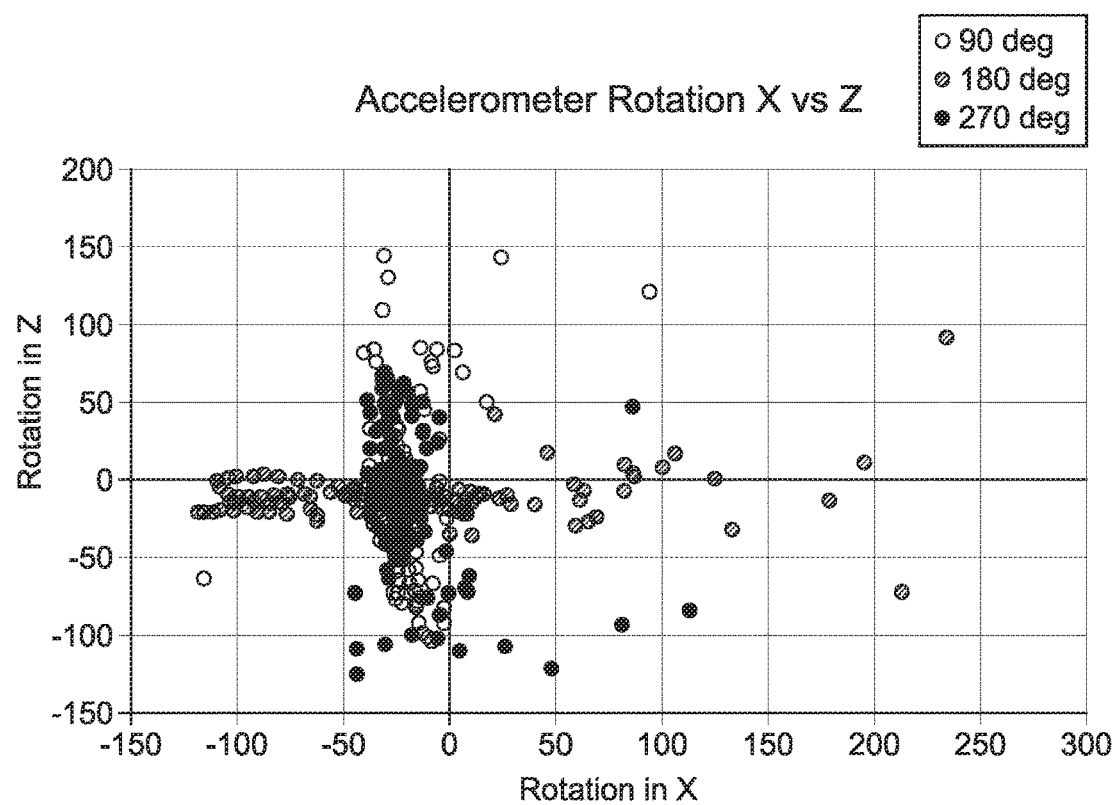
FIG. 18 is a graph showing impact data of the 6" diameter aluminum pole tested in Example 3, when the pole was hit at 90°, 180° and 270°.
Figure 19:
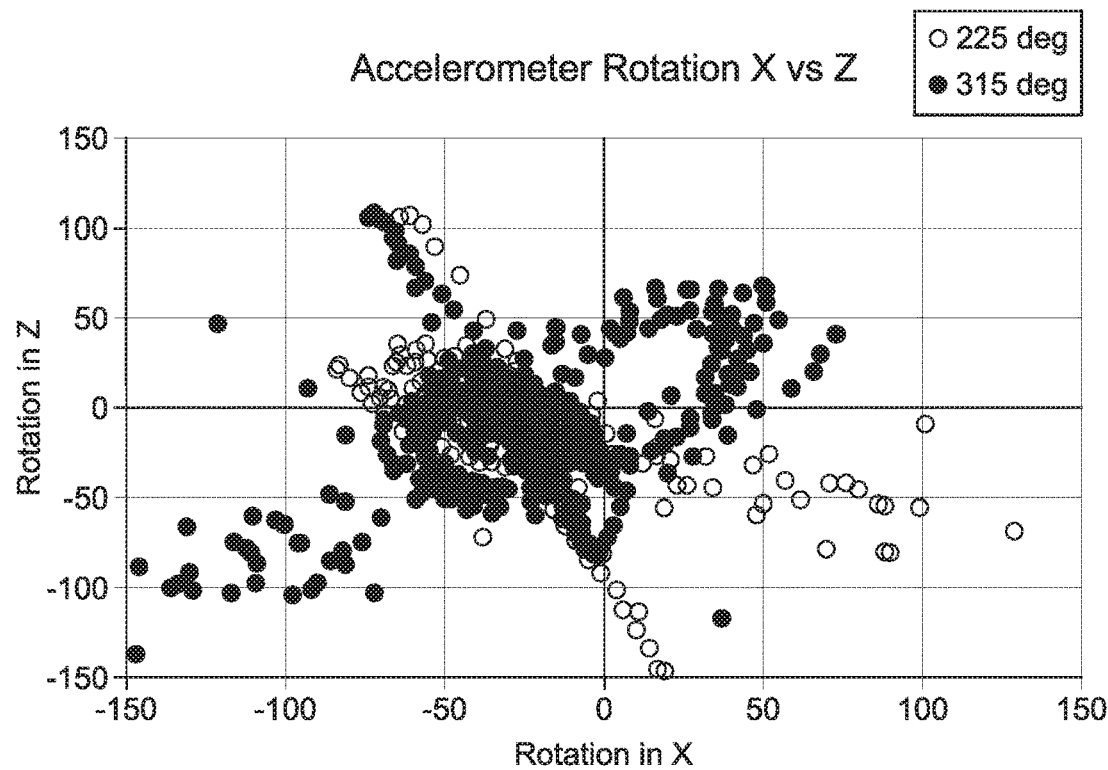
FIG. 19 is a graph showing impact data of the 6" diameter aluminum pole tested in Example 3, when the pole was hit at 225° and 315°.

The same behavior was also observed in opposite deflection followed by dampening to steady state when tests were performed at 45°, 90°, 135°, 180°, 225°, 270° and 315°. FIG. 17 is a graph of the impact data at 45° and 135°. There is overlap between the 45° plots and the 135° plots. FIG. 18 is a graph of the impact data at 90°, 180° and 270°. The 90° plots and 270° plots both extend roughly vertically along the graph and there is significant overlap between the two. FIG. 19 is a plot of the impact data at 225° and 315°. The 225° plots and the 315° plots significantly overlap as well.

When the pole was hit at an angle the resulting rotation is shown in FIG. 16 and FIG. 17. The center of rotation was observed to be behind the accelerometer, which is true to the way the accelerometer was mounted on the surface of the pole, while the center of rotation was inside the pole.

TABLE 7

DATA CAPTURED FROM EXTERNAL IMPACT TEST (NOTE SOME Z MAXIMUM AMPLITUDES ARE NOT AVAILABLE DUE TO RAW DATA BEING CAPTURED AS A CHARACTER RATHER THAN NUMBER)

| Pole | Degree of Impact | Impact Object Mass (kg) | Maximum Impact Amplitude X | Maximum Impact Amplitude Y | Maximum Impact Amplitude Z |
|---|---|---|---|---|---|
| 6" Aluminum | 0 | 2.72 | 5,292 | 20,000 | 5,894 |
| 6" Aluminum | 45 | 2.72 | 10,705 | 23,242 | 9,002 |
| 6" Aluminum | 90 | 2.72 | 7,348 | 20,156 | 32,767 |
| 6" Aluminum | 135 | 2.72 | 14,590 | 34,476 | 21,300 |
| 6" Aluminum | 180 | 2.72 | 8,452 | 28,782 | 32,767 |
| 6" Aluminum | 225 | 2.72 | 23,890 | 26,628 | 30,116 |
| 6" Aluminum | 270 | 2.72 | 20,936 | 25,186 | 11,034 |
| 6" Aluminum | 315 | 2.72 | 32,767 | 25,804 | 4,898 |

It was demonstrated that the accelerometer was able to detect the pole leaning in various degrees. When the pole was upright, that position was defined as zero degree leaning. When the pole leaned, the system monitored the pole leaning in various degrees as shown below.

Figure 20:
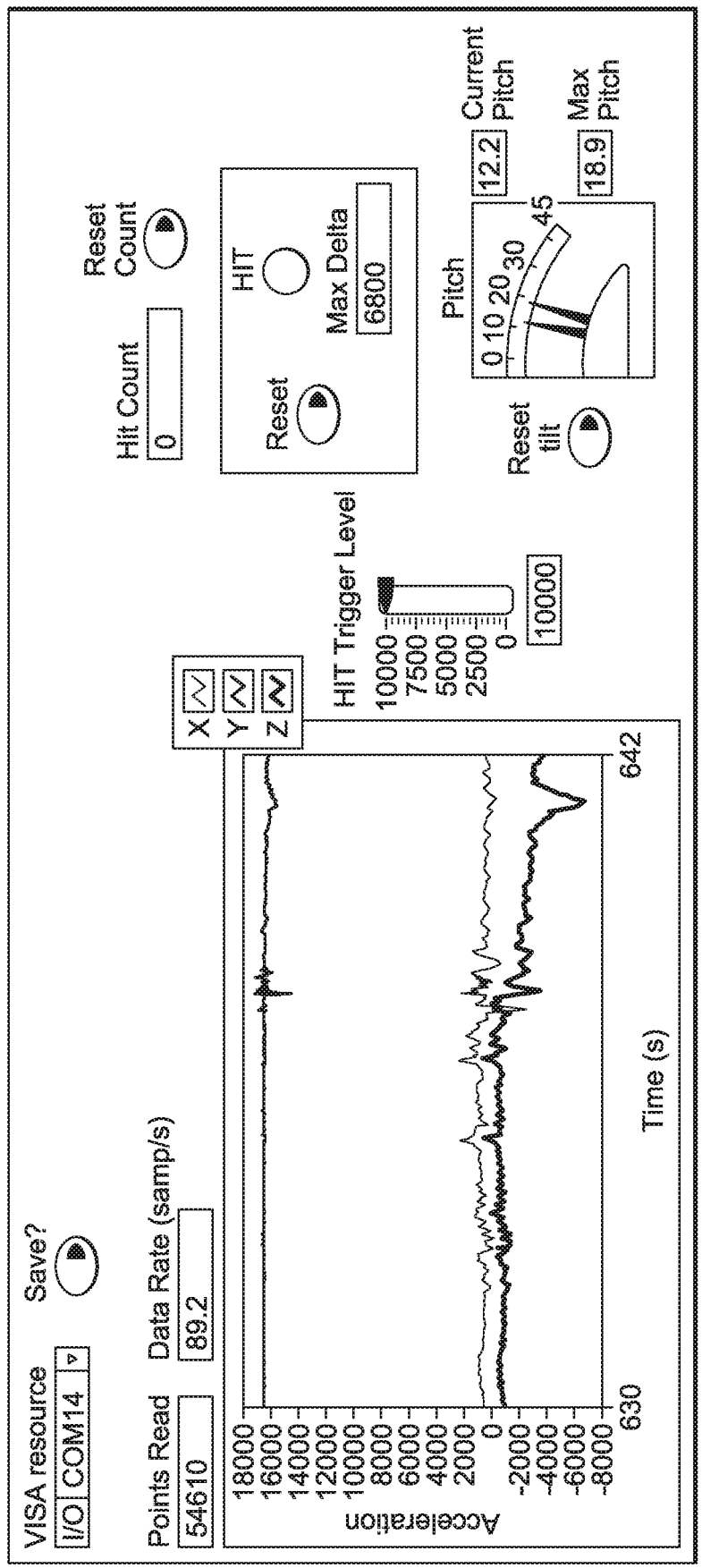
FIG. 20 is a screenshot of computer readings taken during Example 3, wherein the 6" diameter aluminum pole is titled to 10°, and a pitch meter shows a reading of 10°.
Figure 21:
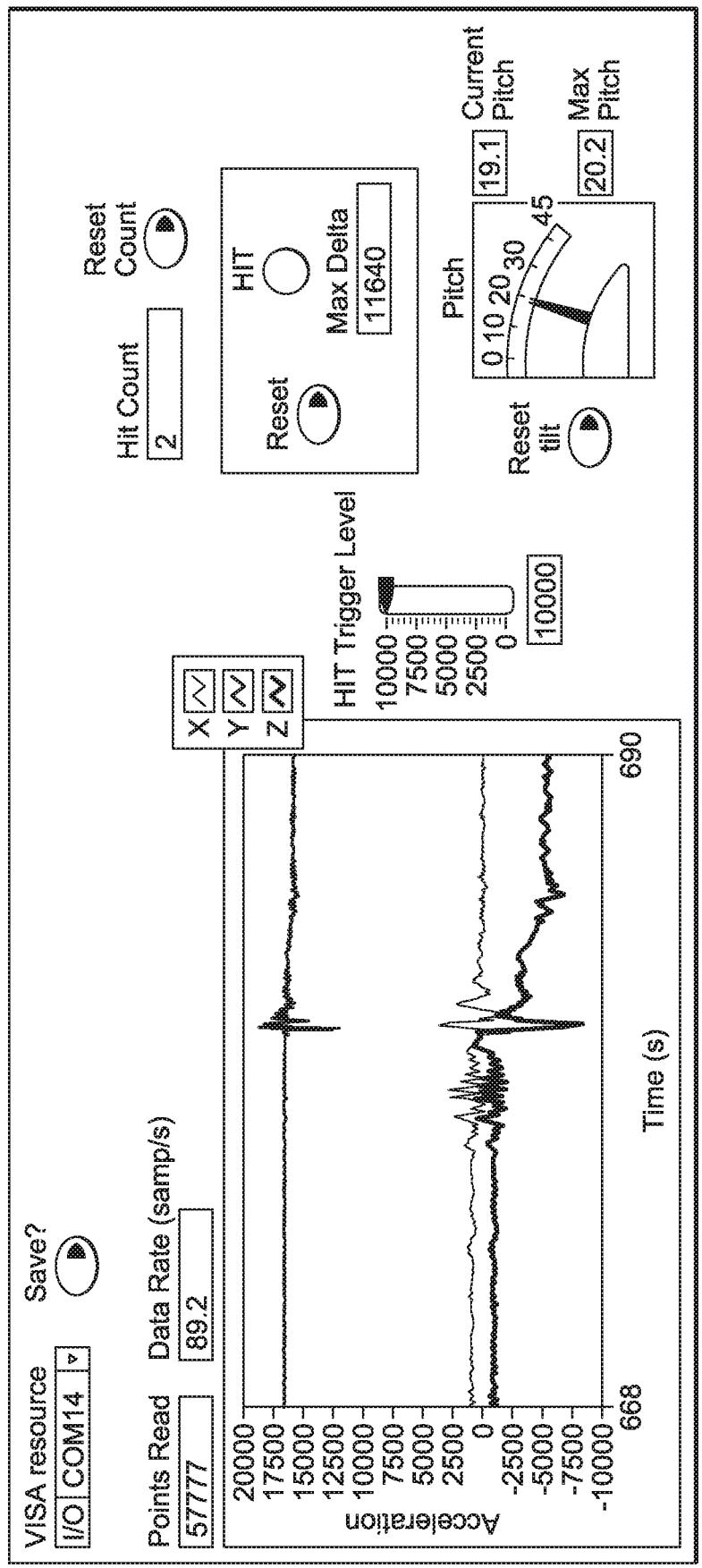
FIG. 21 is a screenshot of computer readings taken during Example 3, wherein the 6" diameter aluminum pole is titled to 20°, and the pitch meter shows a reading of 20°, with a sudden large change in angle detected causing a "hit" alarm to set off.
Figure 22:
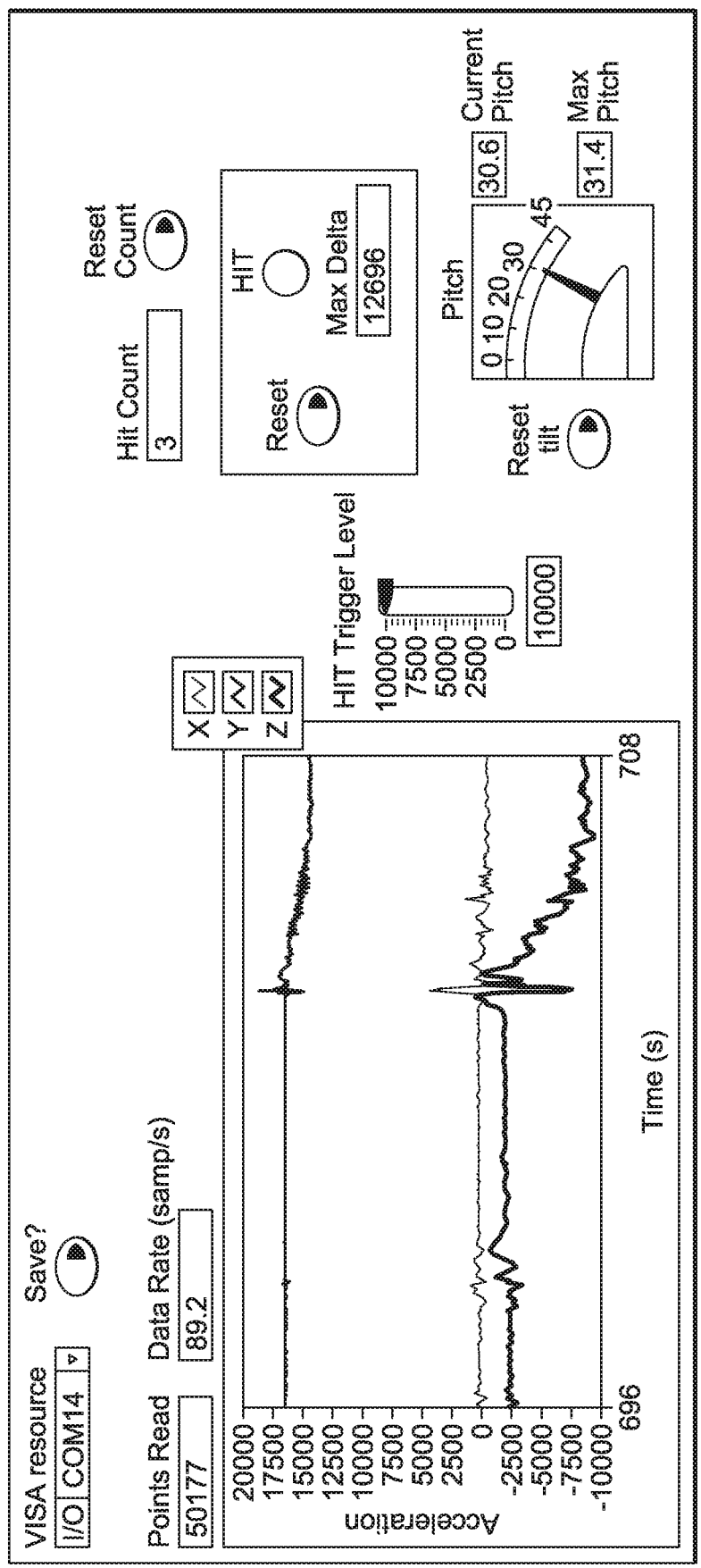
FIG. 22 is a screenshot of computer readings taken during Example 3, showing the pole tilt at 30°, and the pitch meter at 30°.
Figure 23:
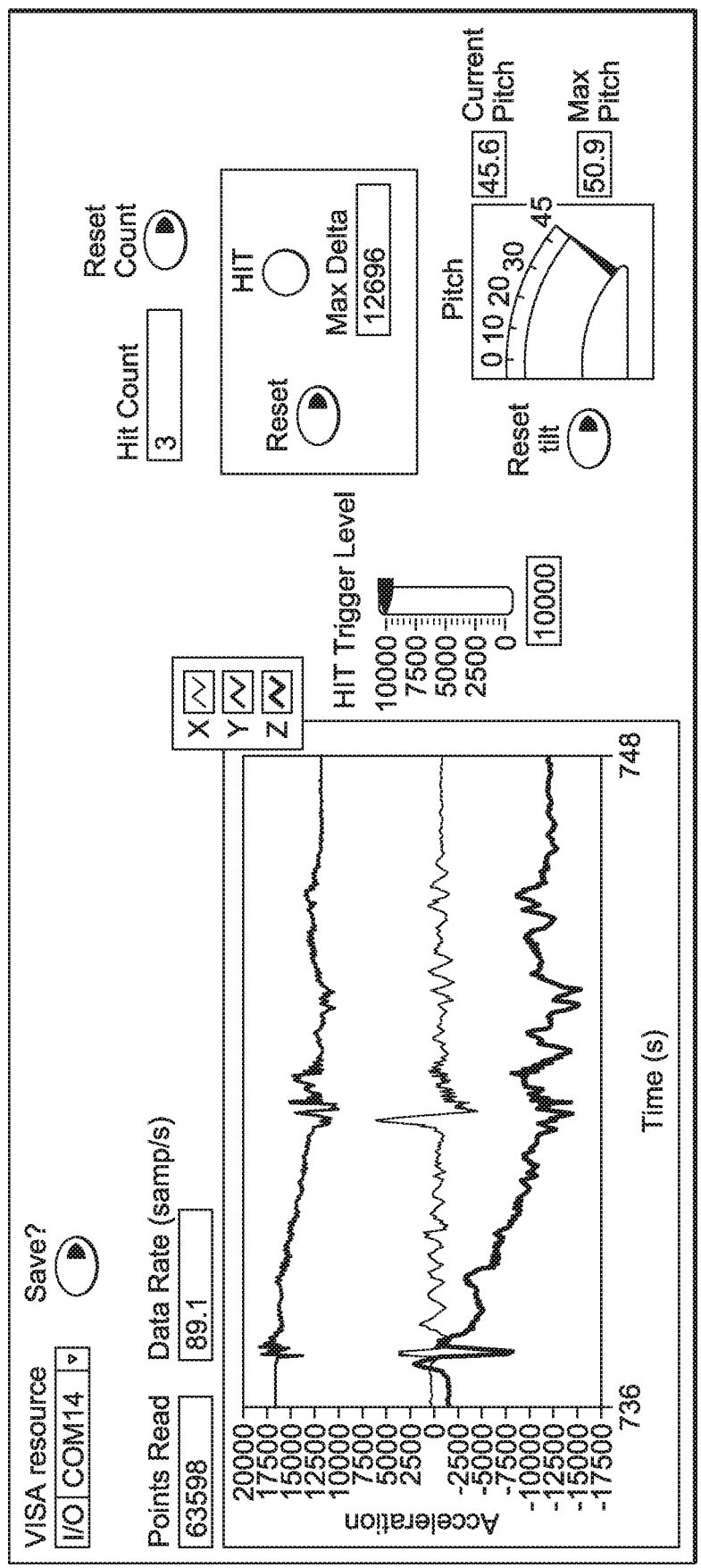
FIG. 23 is a screenshot of the computer readings of Example 3, wherein the 6" diameter aluminum pole is titled to 45° and the pitch meter shows a reading of 45°.

FIGS. 20-23 are screenshots of computer readings taken during Example 3. The screenshots show the tilt of the pole at 10°, 20°, 30 and 45° and the accompanying pitch meter readings. The resulting angle caused the changes amplitude in the X Y Z axes as opposed to time. In the graphs in FIGS. 20-23, the top most lines are the Y-axis readings, the middle lines are the X-axis readings, and the bottom lines are the Z-axis readings. FIG. 20 shows the pole tilt at 10° and the pitch meter showing 10°. FIG. 21 shows the pole tilt at 20° and the pitch meter showing 20°, with a sudden large change in angle detected causing a "hit" alarm to set off. FIG. 22 shows the pole tilt at 30° and the pitch meter showing 30°. FIG. 23 shows the pole tilt at 45° and the pitch meter showing 45°.

CONCLUSION: The results of this test demonstrated that the sensing system can successfully detect an external impact to the pole, and with some simple algebra, even enable the direction of impact to be determined with high accuracy. When the mass (hammer) struck the pole, the accelerometer showed the large initial movement at impact as well as the subsequent transient dampening of the movement on the pole. The acceleration amplitudes were not consistent due to the variability of force when manually striking the pole, but using axis rotation, the experiment was able to prove the amount of movement and the direction of movement. This was verified across all three axes of movements in the pole. Depending on the angle, the x, y, and z axes were affected in different ways where x was left/right, z was forward/backwards (normal to the accelerometer module), and y was up/down. The relationship between the x and z axes were not as expected because the angles of impact were measured with respect to the base and not to the accelerometer. Because the accelerometer was wired, there was no external electromagnetic interference captured by the software.

As noted above, the impact sensor can be a three-dimensional accelerometer. It can measure quick vibration/striking, such as a sudden impact, and it can also detect if the pole is leaning or falling past 30 degrees from its original vertical position. It can also measure consistent or chronic impact, for example, like an earthquake, which typically has a frequency of 10 Hz.

Example 4: Vibration Detection (Strong Wind, Earthquake)

Southern California's close proximity to the San Andreas Fault raises the need to prepare for possible earthquakes that can induce stress and may damage power poles. Strong wind in storms can also induce vibrations on the pole. The objective of this test was to simulate and demonstrate the sensing system's ability to detect vibrations in its structure which can be used to detect earthquake and windstorm occurrences.

TABLE 8

LIST OF EQUIPMENT USED FOR VIBRATION DETECTION TEST.

| Name | Model/Serial # | Quantity | Notes |
|---|---|---|---|
| Vibration Motor w/ Variable Frequency Drive Controller | N/A | 1 | Used to induce vibrations on the IMP. |
| Accelerometer | Arduino Unit | 1 | Used to measure impacts. |

PROCEDURE: First, the 6" diameter aluminum pole was set up in the testing apparatus shown in FIG. 12. Next, a vibration motor was mounted on the bottom of the pole, as shown in FIG. 12. Then, the program was run for 10 seconds at idle. Next, the motor was turned on at 10 Hz and run for 30 seconds. Then, the motor was turned off and the program was run for 10 seconds. Finally, the above steps were repeated at 15 Hz and 20 Hz.

OBSERVATIONS AND DATA: Accelerometers are devices that measure acceleration, which is the rate of change of the velocity of an object. They measure in meters per second squared (m/s2) or in G-forces (g). Accelerometers are useful for sensing vibrations in systems or for orientation applications.

Figure 24:
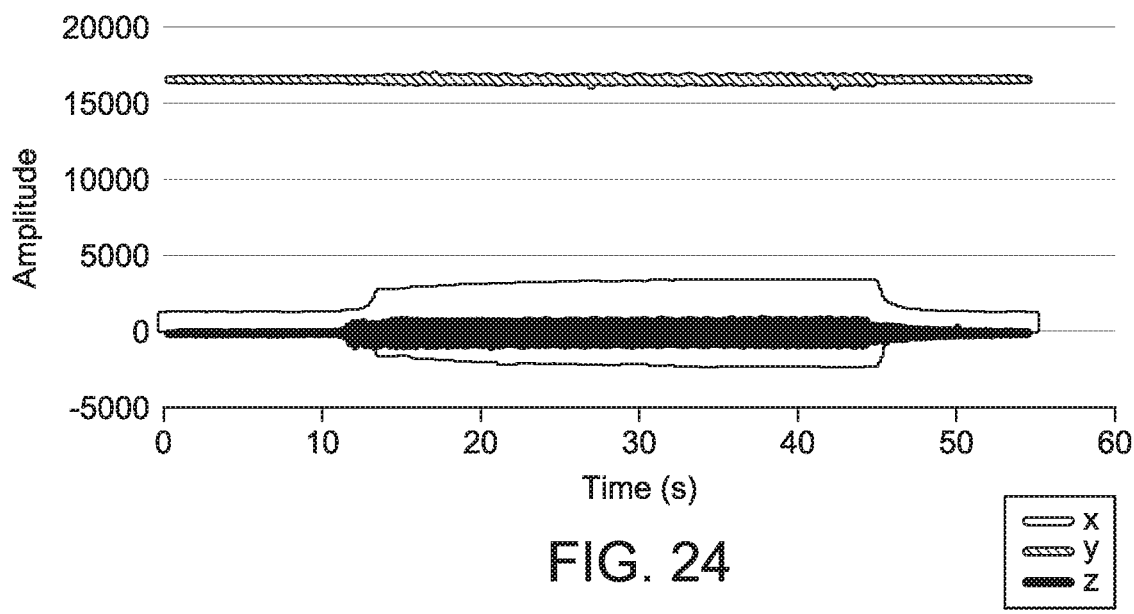
FIG. 24 is a graph showing vibration data of Example 4, at 10 HZ.
Figure 25:
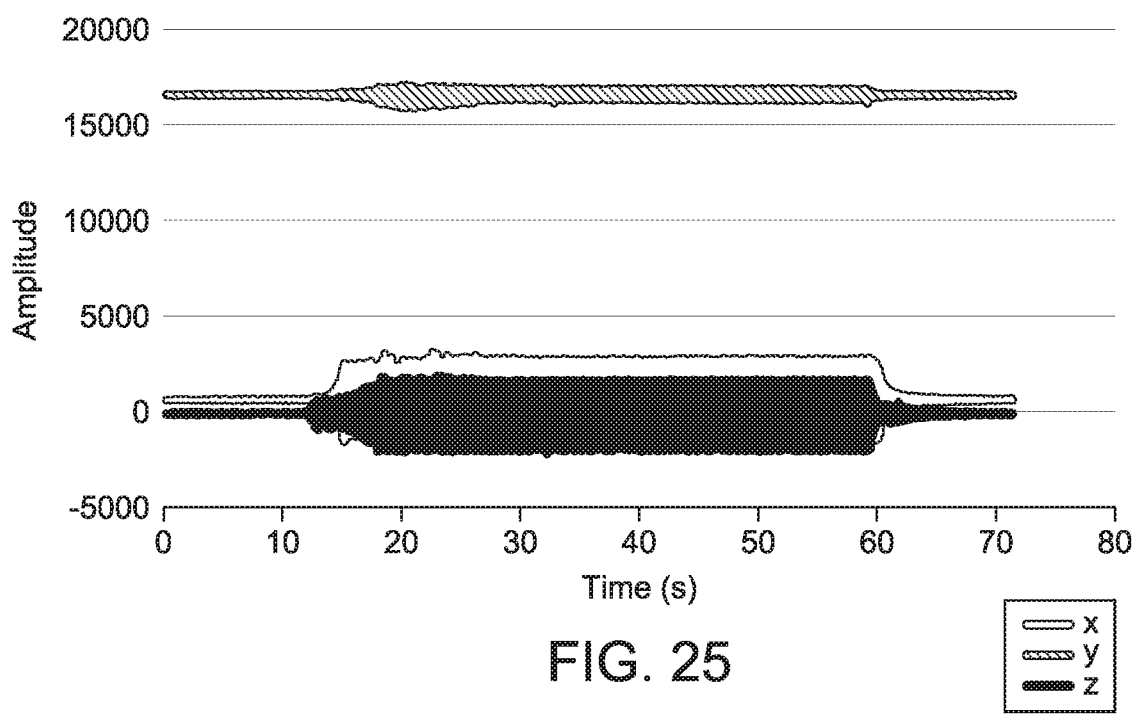
FIG. 25 is a graph showing vibration data of Example 4, at 15 HZ.
Figure 26:
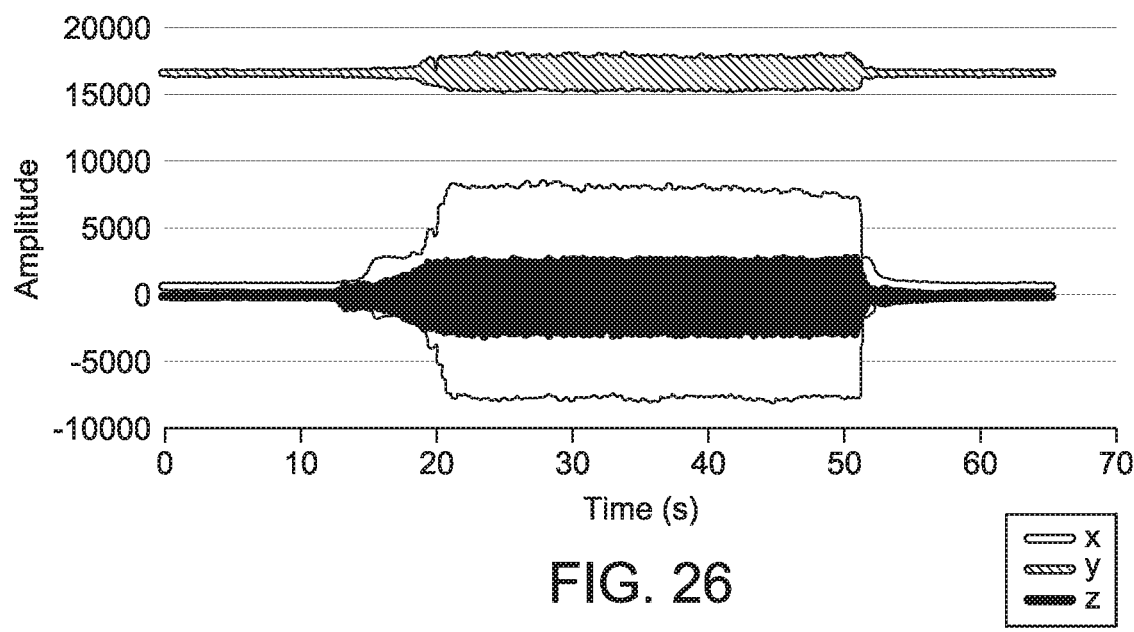
FIG. 26 is a graph showing vibration data of Example 4, at 20 HZ.

In the test, it was observed, as shown in FIG. 24, that the accelerometers were able to detect low vibration on the pole base. The movement of the y axis was also monitored, which is movement into and out of the ground. In monitoring earthquakes, the ability to monitor all six (6) axes is important. When used in conjunction with the acceleration in all six (6) axes, it is believed that actual earth movement could be modeled. The amplitude on these graphs was calibrated to G-force. However, it was observed that the higher the frequency and the stronger the vibration, the higher the amplitude that was measured. In a future prototype, amplitude can be calibrated to signify a certain event such as strong wind above certain threshold. FIG. 24 is a graph of vibration data at 10 HZ. FIG. 25 is a graph of vibration data at 15 HZ. FIG. 26 is a graph of vibration data at 20 HZ. In FIGS. 24-26, X amplitude is labeled X, Y amplitude is labeled Y, and Z amplitude is labeled Z.

TABLE 9

DATA CAPTURED FROM VIBRATION DETECTION TEST

| Pole | Frequency (Hz) | Maximum X Amplitude | Maximum Y Amplitude | Maximum Z Amplitude |
|---|---|---|---|---|
| 6" Aluminum | 10 | 2,772 | 16,884 | 818 |
| 6" Aluminum | 15 | 3,092 | 17,094 | 1,868 |
| 6" Aluminum | 20 | 8,294 | 17,958 | 2,752 |

CONCLUSION: The results of this test demonstrated that the sensing system was able to detect vibrations that caused oscillations on the pole. The graph from the accelerometer shows that when the vibrator motor was turned on, the software was able to capture those motions. As the frequency (Hz) increased there was a marked increase in amplitude across all three axes. This was consistent with expectations. Furthermore, the maximum recorded amplitude increased as frequency went up which bolstered this observation. In future iterations, the accelerometer could be used in conjunction with more robust strain sensors and those two inputs could allow for even greater detection of vibrations on the system. Further development in the software could allow the system to distinguish between different situations such as earthquakes or windstorms.

Example 5: Downed-Wire Detection

Wires on utility poles are under high tension, and a whole range of environmental variables can cause excess stress on the lines. Wire breaks do occur and sudden loss of tension on the line will reduce the load on the pole and in some instances, will send a vibration that can be picked up by the strain sensors. The purpose of this test was to demonstrate that the system could successfully detect sudden loss of tension caused by a downed line.

PROCEDURE: First, the 6" diameter aluminum pole was set up in the test apparatus as shown in FIG. 12. Next, the pole was leaned and the program started. The pole was held in position for 10 seconds and then the pole was released and data was captured for 40 seconds. Finally, the above steps were repeated for two additional trials, totaling a total number of three trials.

Figure 27:
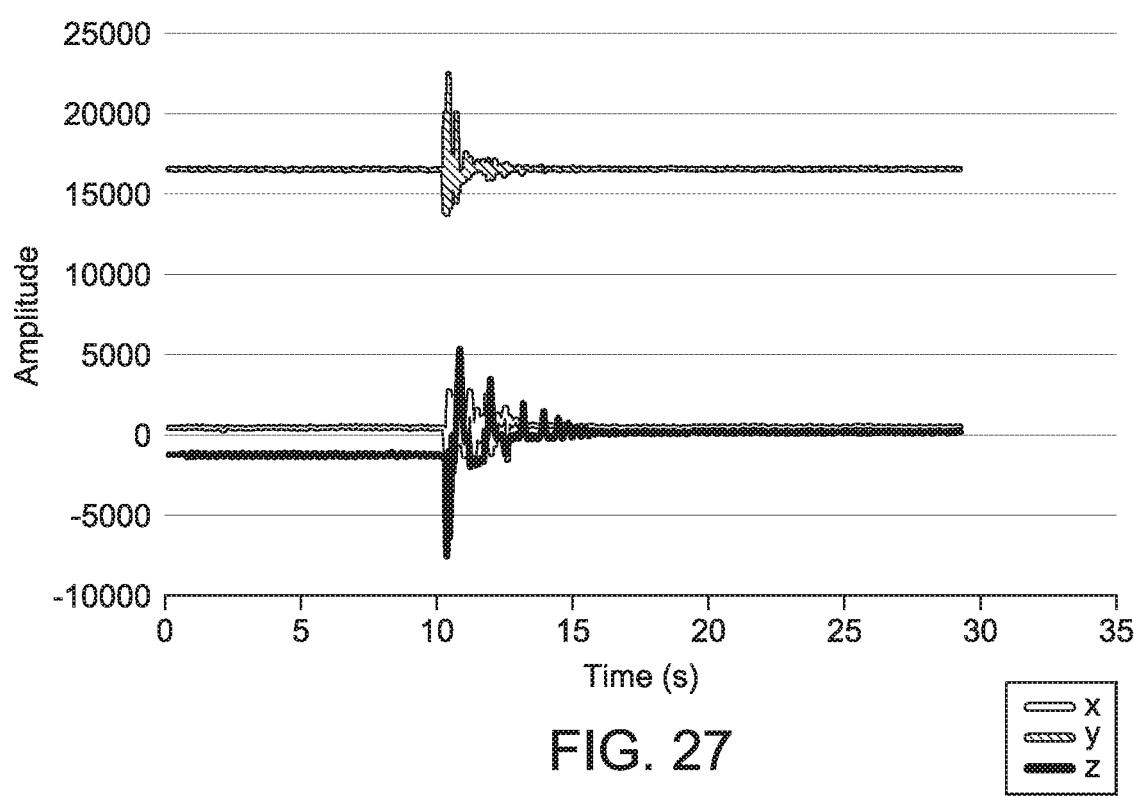
FIG. 27 is a graph showing movement of a 6" diameter aluminum pole during Trial 1 of Example 5.
Figure 28:
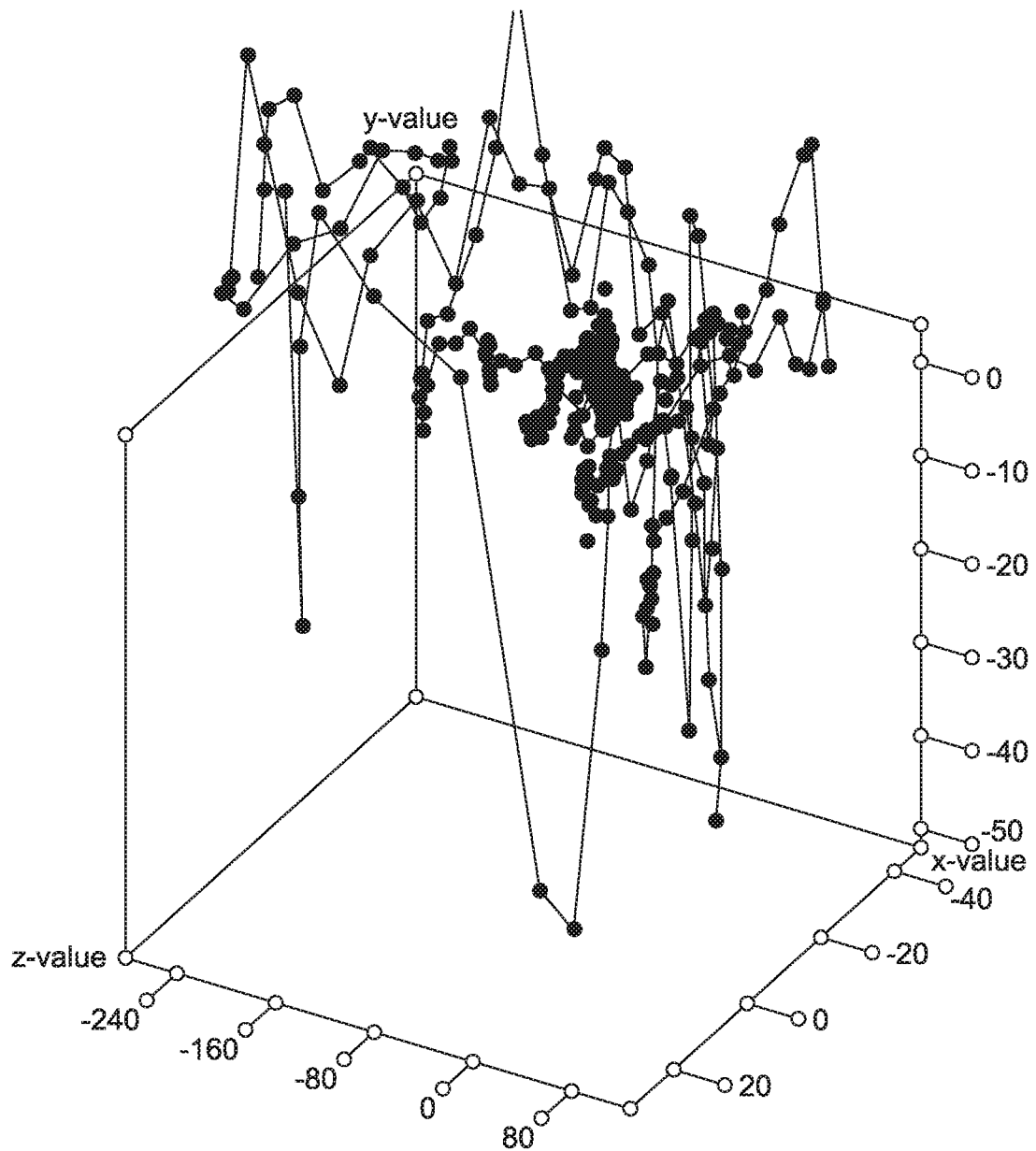
FIG. 28 is a 3-dimensional graph showing movement of the 6" diameter aluminum pole during Trial 1 of Example 5.

OBSERVATIONS AND DATA: FIG. 27 is a graph showing pole movement through all 6 axes during Trial 1. FIG. 28 is a three-dimensional graph showing movement of the pole in Trial 1, allowing movement of the pole to be tracked.

TABLE 10

DATA CAPTURED FROM WIRE BREAK TEST WHICH SHOWS THE ACCELERATION AMPLITUDE

| Pole Type | Trial | Maximum X Amplitude | Maximum Y Amplitude | Maximum Z Amplitude |
|---|---|---|---|---|
| 6" Aluminum Pole | 1 | 2,790 | 22,400 | 5,368 |
| 6" Aluminum Pole | 2 | 2,514 | 19,036 | 4,564 |
| 6" Aluminum Pole | 3 | 3,102 | 20,718 | 4,826 |

CONCLUSION: The results of this test demonstrated that when steady tension was applied and then suddenly lost, the sensing system was able to detect that loss of tension. That situation simulates if a downed wire situation were to occur and the pole suffered a loss of tension. Looking at the graphs, once tension was released, the pole resonated due to the imbalance of tension applied to either side. Consistently across all three trials, the y amplitude was greatest which was expected as the y axis comes out of the ground and the tipping of the pole created the greatest change in this direction. This behavior was seen in the graph of the accelerometer movements, which lead to the conclusion that the system was able to detect downed wires. Currently, the software is also able to detect the greatest tilt angle and the current pitch of the pole (relative to the ground). Utilizing this data across all axes allows the power company to monitor the direction the pole is leaning. Further software development including Remote Fault Indicator (RFI) integration would create a more complete picture for downed-wire situations since a loss of voltage would also occur.

Preferably, the downed-wire sensor can sense fault on conductor itself, measure loss of current or voltage, and can sense a broken wire.

Regarding Examples 6 through 12:

The goal of the factory acceptance test (FAT) documented in Examples 6 through 12 was to demonstrate the baseline capabilities of the system to detect certain pole conditions (fire, tilt, loading [strain], vibration, etc.) alone and in specified combinations intended to simulate particular test cases, and to show the systems' ability to generate local and remote alarms at appropriate times. Test cases of interest that were demonstrated include fire detection, dynamic pole loading—tension, dynamic pole loading—external impact, dynamic loading—vibration, dynamic pole loading—damage assessment, and downed wire detection—wire break.

Figure 29:
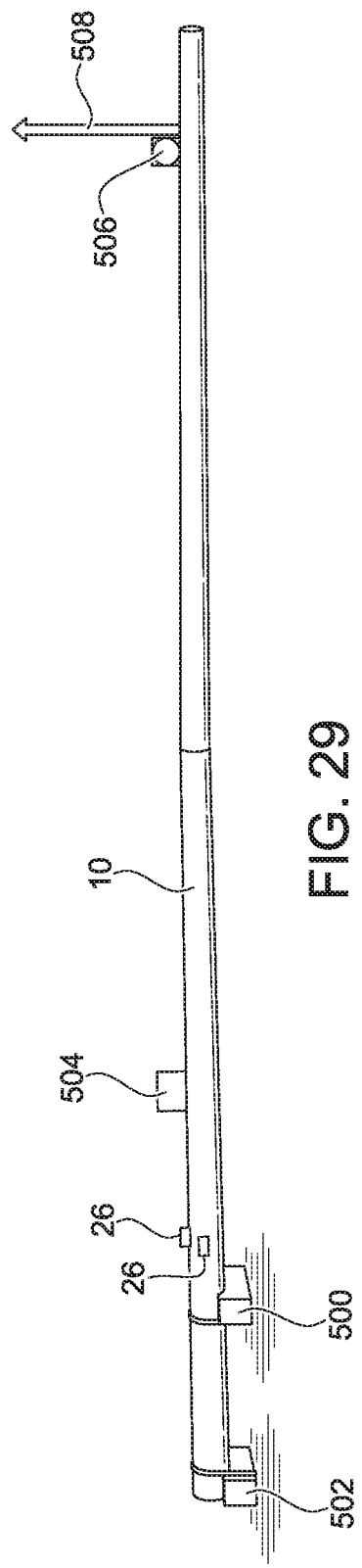
FIG. 29 is side view of a testing apparatus used in Examples 6 through 12.
Figure 30:
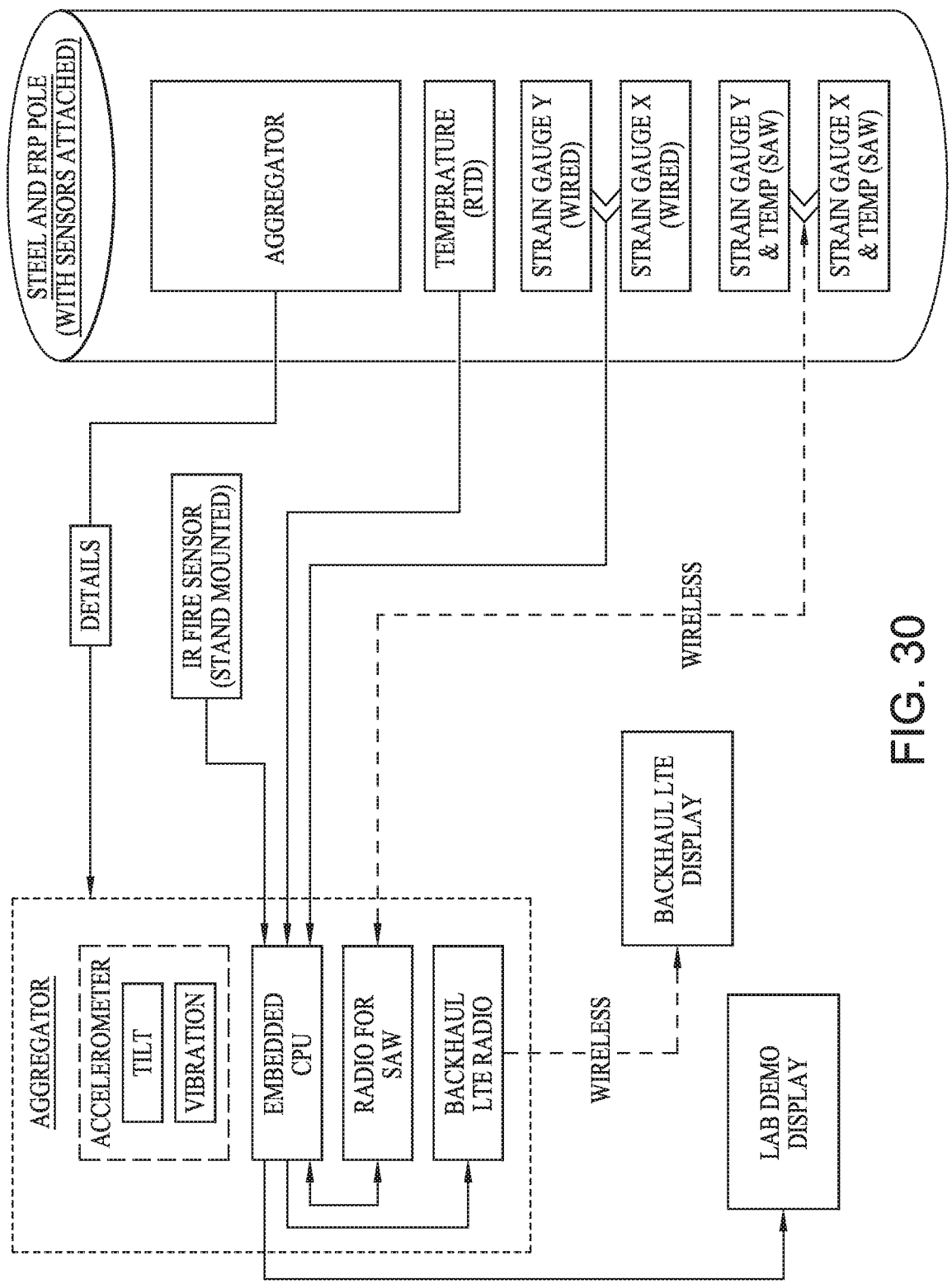
FIG. 30 is diagram showing a testing system used in Examples 6 through 12.

The factory acceptance test included sensors 26 mounted to a 50 ft. hybrid pole 10 mounted horizontally as shown in FIG. 29. The pole 10 was strapped to a wood mount 500 and anchored to a concrete floor 502. An aggregator 504 mounted on the pole 10 collected data from wired commercial off-the-shelf (COTS) sensors 26 (temperature, strain, IMU (accelerometer), and fire) and from wireless SAW temperature and strain sensors 26. The fire sensor (not shown in FIG. 29) was mounted near the aggregator 504 on a stand to allow line of sight with an outdoor fire. An industrial vibrator 506 and a vertical hoist 508 were also coupled to the pole 10. A local demonstration workstation was provided to display sensor data. Alarms were transmitted wirelessly to a remote demonstration display. A system diagram is shown in FIG. 30.

The first step in the FAT was inspection and verification of the components included in the equipment that was to be tested during the FAT. All equipment was verified except the SAW wireless strain and temperature sensors, which were broken. Inclusion of data from these wireless sensors in prior reports satisfied this requirement.

Example 6: Fire Detection

The purpose of this test was to demonstrate that the system was able to detect changes in the pole and its immediate environment that indicated the presence of a fire. Two fire indicators were demonstrated: detection of pole temperature changes which may indicate the presence of a fire, and direct detection of a fire using an IR fire detector.

The temperature change test was conducted using a heat gun to heat the pole near the sensor. Wired temperature sensors provided a reading of pole temperature, and a high temperature alarm was generated when the pole reached a predefined temperature of 90° F. A fire alarm was generated when the pole temperature reached a 150° F.

Figure 31A:
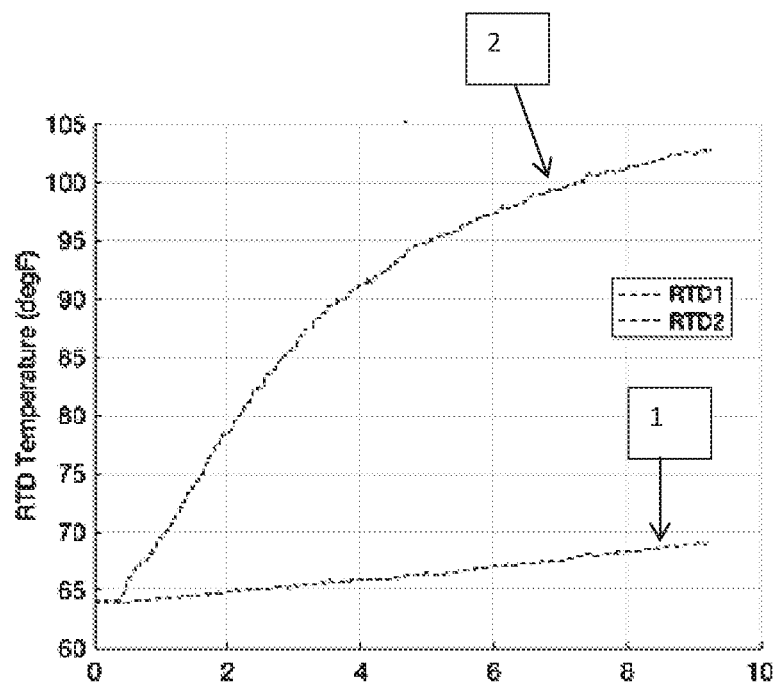
FIG. 31a is graph showing measurements of pole temperature taken by two wired temperature sensors.
Figure 31B:
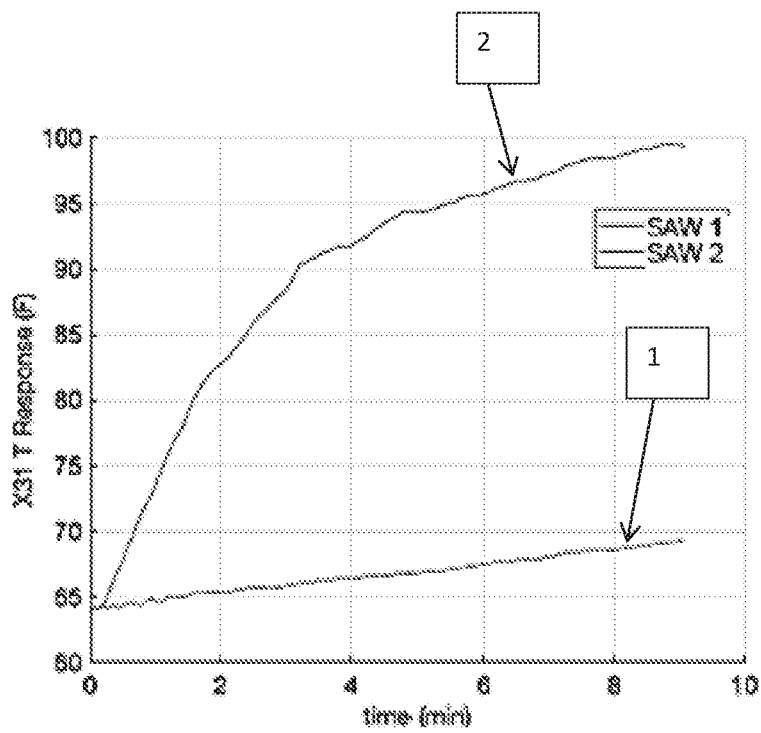
FIG. 31b is a graph showing measurements of pole temperature taken by two wireless SAW sensors.

The wireless SAW temperature sensors mounted on the pole were damaged during pole impact testing shortly before the FAT, and hence these devices were unavailable during the conduct of the FAT. However, multiple tests were conducted with SAW wireless temperature sensors, both before and after the FAT. Measurements of pole temperature made using the wireless SAW sensors were in good agreement with the data from the wired temperature sensors, as shown in FIGS. 31a and 31b.

Figure 32:
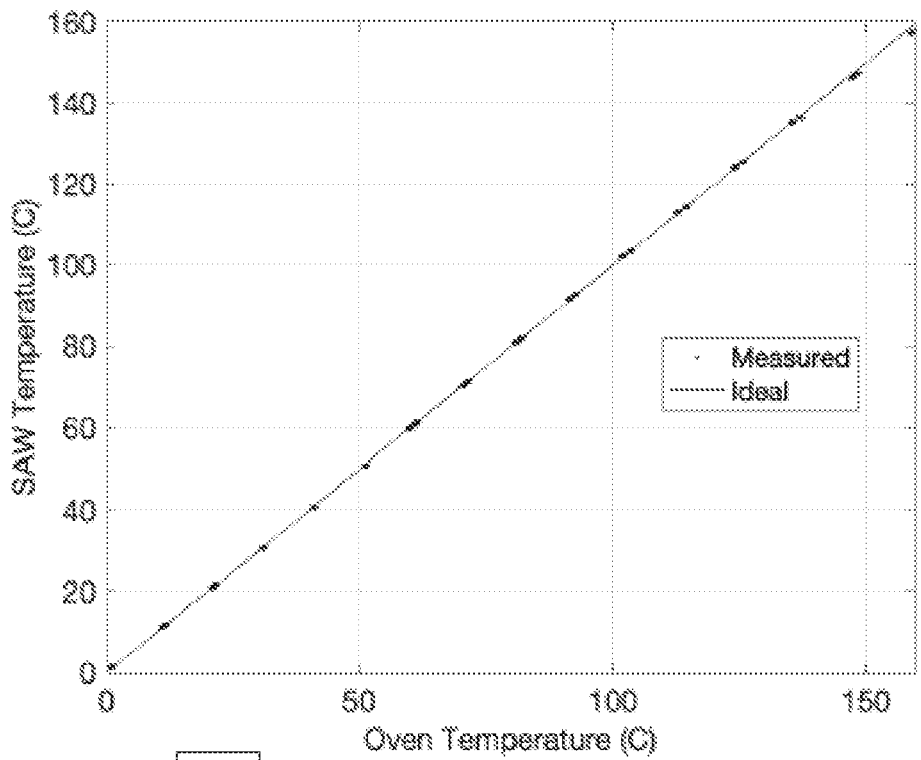
FIG. 32 is a graph showing the accuracy of the wireless surface acoustic wave (SAW) sensors used in Example 6.

The slight difference in measured pole temperature between the wired RTDs (resistance temperature detector) and the wireless SAW devices reflected an actual difference in pole temperature due to the location at which the heat source was applied to the pole. The two types of sensors were several inches apart on the pole, and depending on precisely where the heat gun heat source was applied, the pole temperature at each sensor varied by a few degrees. FIG. 32 shows that the accuracy of the SAW wireless temperature sensors was better than 0.5° F., as determined by calibration testing performed in an oven with reference thermocouples.

Figure 33A:
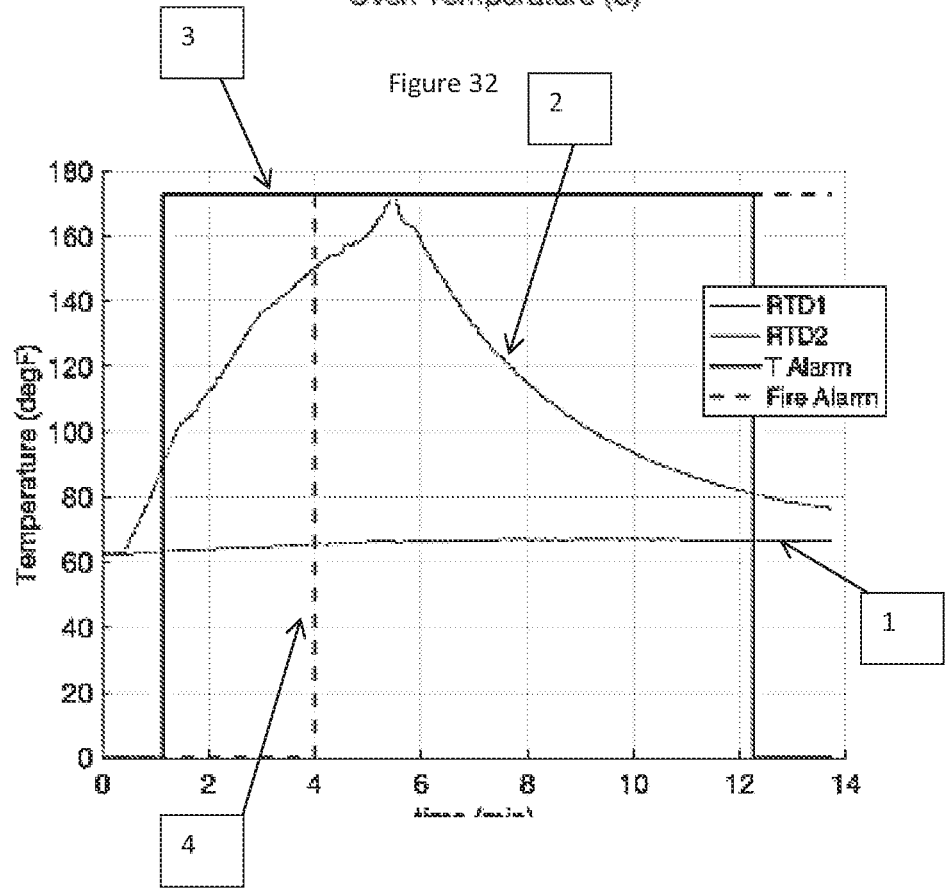
FIG. 33a is a graph showing readings of the wired temperature sensors along with a temperature alarm and a fire alarm in Example 6.
Figure 33B:
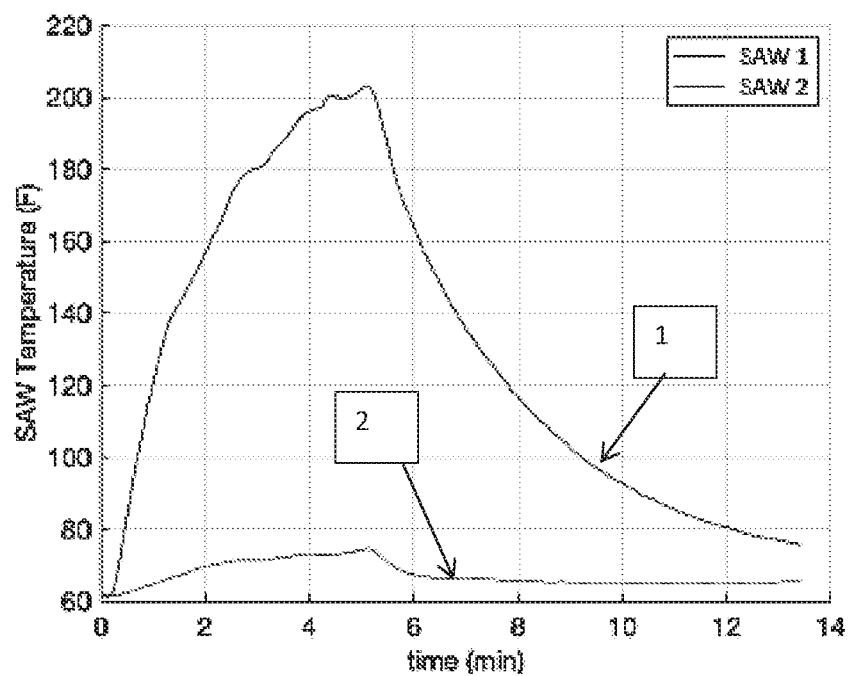
FIG. 33b is a graph showing readings of the wireless SAW sensors that accurately measured temperature at levels high enough to trigger an alarm.

While the high temperature alarm and the fire alarm during the FAT were triggered based on the temperature being measured by the wired RTDs, SAW sensor data could also have been used to trigger these alarms, had these sensors been operational during these tests. Additional testing (before and after the FAT) showed that the wireless SAW temperature sensors accurately measured temperature at levels high enough to trigger alarms, as shown in FIGS. 33a and 33b. In FIG. 33a RTD1 is labeled 1, RTD2 is labeled 2, a alarm is labeled 3 and fire alarm is labeled 4. Maximum temperatures measured by the wireless SAW temperature sensors slightly exceeded 200° F. during tests, while the temperature of the pole at RTD locations reached 170° F.

Wireless SAW temperature sensors that are robust to impact are available, using mechanically compliant die attach materials to isolate the SAW device from the effects of impact. Such sensors can be used in future power pole systems for wireless temperature measurement for fire detection.

Figure 34:
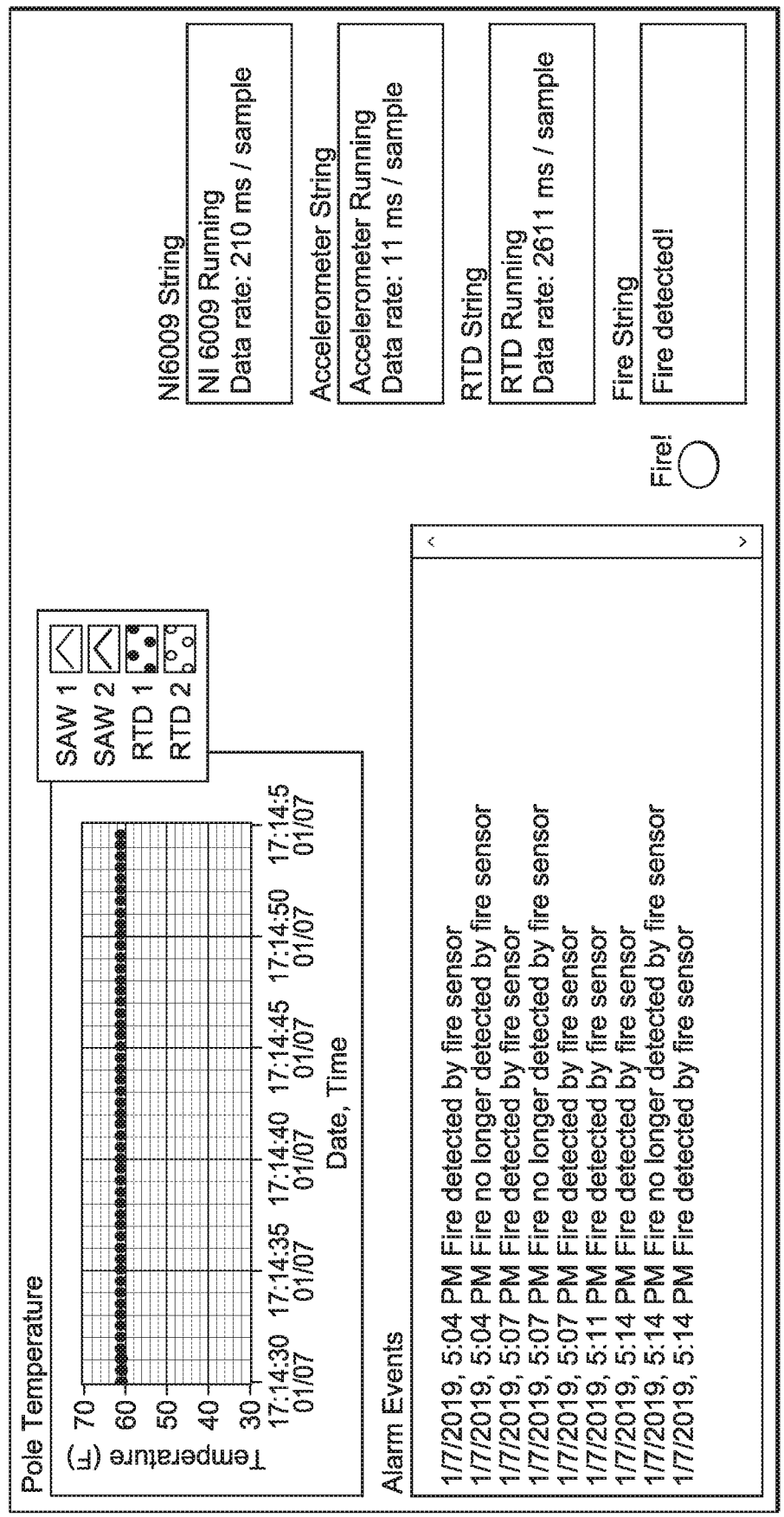
FIG. 34 is a screenshot of computer reading taken during Example 6, where the status of a fire detection sensor is displayed in real time and alarms were communicated to the computer as well.

Infra-red (IR) fire detection was also demonstrated. A small, contained fire was started outside the building where the test was being conducted. The IR sensor detected the fire when a loading dock door was opened, and a fire alarm was generated. Extinguishing the fire and/or shutting the loading dock door caused the alarm to go out. The local demonstration workstation displayed the status of the fire detection sensor in real time (FIG. 34) and alarms were communicated to the remote display as well. In FIG. 34, the upper left plot shows pole temperature as measured by the two wired temperature sensors (SAW data was not available during this test). Fire detection triggered a text alert (lower left box) and caused the fire alarm button to turn from green to red (bottom center). Time stamped alerts in the lower left box show a sequence of detecting fire, then having the alarm clear due to no fire detected after a short period, followed by again detecting fire. This sequence corresponds to the actual presentation of a fire located at distances of up to about 30 feet away from the IR detector, with presence and absence of the fire controlled by opening and closing of the loading dock door (to expose the IR sensor to the fire or to prevent it from 'seeing' the fire). Note that since the IR sensor is able to detect fire at a distance, the pole temperature remained constant during this test sequence (since no fire had reached the pole).

Remote alarms were also triggered by detection of fire. The data was communicated to a cloud-based monitoring portal, and was displayed on a wide range of devices—for example the laptop screen used in the FAT. Note that alarm status buttons for all types of system alarms are shown, with green buttons representing a "system OK" status for each type of alarm. Detection of conditions that would trigger an alarm caused the appropriate alarm to turn red, and a text message appeared to the right of the alarm type label indicating the condition detected.

Example 7: Dynamic Pole Loading—Tension Detection

The purpose of this test was to demonstrate that the IMP was able to detect tension applied to the pole, and measured changes in this loading. Strain sensors were utilized to measure loading, with both wireless SAW strain sensors and conventional wired strain transducers tested. Two of each type of strain sensor were mounted close to the base of the pole (slightly above 'ground level'). The pairs of sensors were positioned 90 degrees apart circumferentially to allow detection of strain produced by pole loading that caused pole deflection in any direction. The measurement axis of each sensor was along the length of the pole, and the SAW sensors were mounted co-linearly with and immediately above the conventional sensors on the pole. For most tests, the pole was oriented so that one set of strain sensors was on the bottom side of the pole, so that application of tension via the hoist caused tension in that side of the pole. In this orientation, the other set of sensors was necessarily on the side of the pole.

BDI 350 strain transducers from Bridge Diagnostics, Inc., having a place of business in Louisville, Colo., and the wireless SAW strain sensors were all bolted to the pole using steel blind rivet nuts installed in holes drilled into the pole A preferred mounting method is bolting each sensor directly onto threaded holes made in two separate, flat, welded steel pole extensions that were separated by the proper distance to accommodate the sensors. This approach performed comparably to the welded approach short-term (verified by testing).

Figure 35:
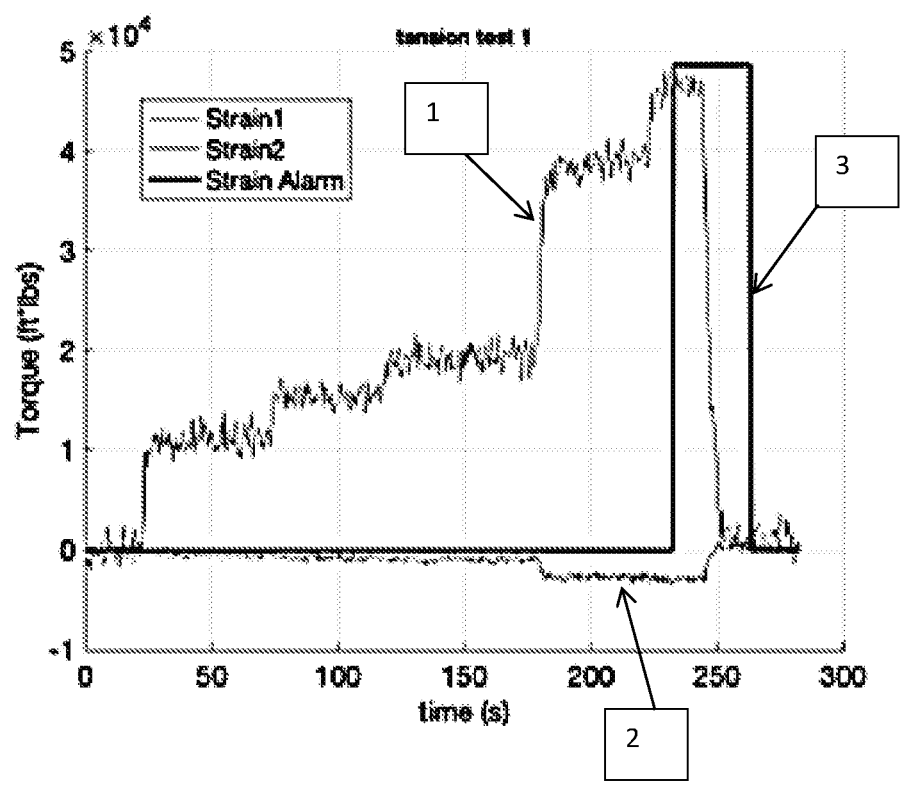
FIG. 35 is a graph showing a data set collected from wired BDI (Bridge Diagnostics Inc.) sensors during Example 7.

During the FAT, the wired conventional strain gauges were used. The hoist was used to apply side loading to the pole and an in-line load cell measured the applied load (in pounds). The measurement system displayed applied load in ft-lb, and the % of design load based on the pole manufacturer's test data for a 65 ft hybrid pole. The applied force was based on manual hoist operation and involved applying sequentially higher forces (approximately 300, 400, 500, 1,000, and 1,200 lb) that correspond to up to 48,000 ft-lb loading, and measuring the strain at each applied load. A pole loading alarm was triggered when the load exceeded 48,000 ft-lb (1,200 lb applied force). FIG. 35 shows a data set collected from the wired BDI sensors during a test sequence. In FIG. 35, Strain1 is labeled 1, Strain2 is labeled 2 and Strain Alarm is labeled 3. The strain sensor on the bottom of the pole (Strain 1) shows sequentially increasing strain readings with each increase in applied load, while the strain sensor on the side of the pole (Strain 2) showed fairly little strain. This is because the hoist motion was vertical, causing the maximum strain to be induced at the location of Strain 1.

Figure 36:
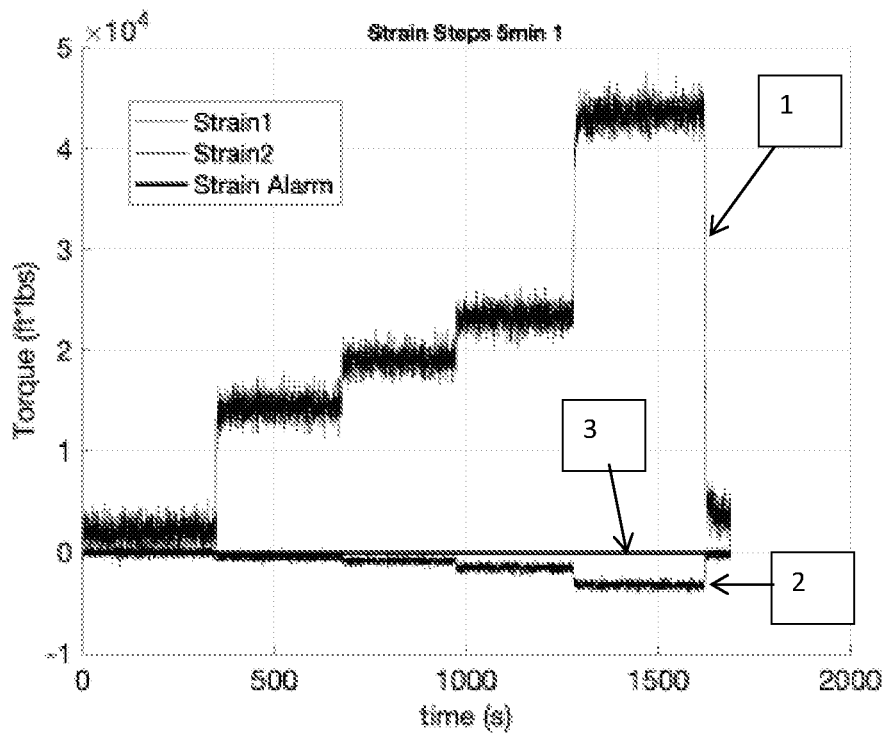
FIG. 36 is a graph showing shows stepped load testing performed in Example 7, where each level of applied load was held for 5 minutes to assess the stability of the sensor readings.

FIG. 36 shows stepped load testing where each level of applied load was held for 5 minutes to assess the stability of the sensor readings. In FIG. 36 Strain1 is labeled 1, Strain2 is labeled 2 and Strain Alarm is labeled 3. The BDI sensors were observed to be quite stable at each level of strain, and no strain alarm was triggered during this test.

Figure 37A:
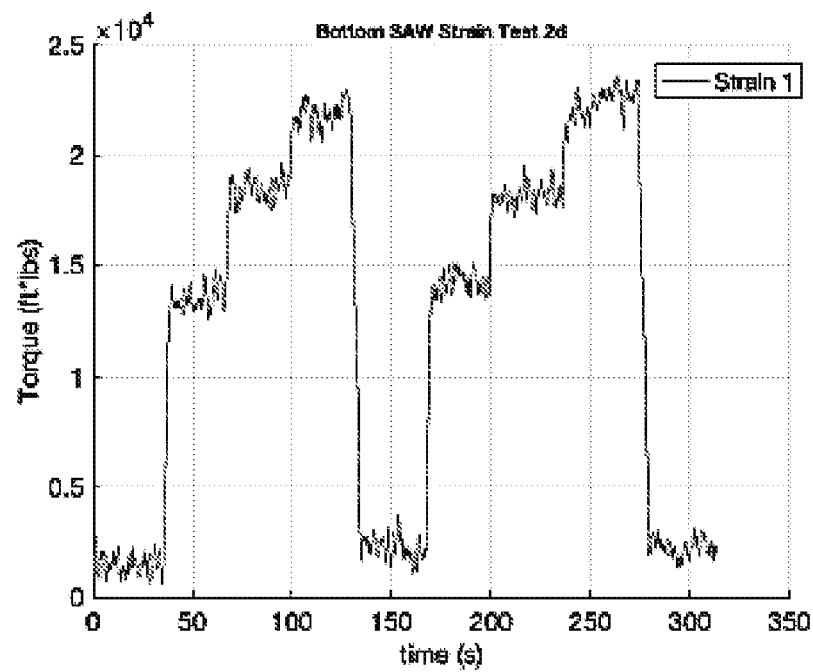
FIG. 37a is a graph showing readings from wired strain sensors from BDI during a typical pole tension testing load sequence performed in Example 7.
Figure 37B:
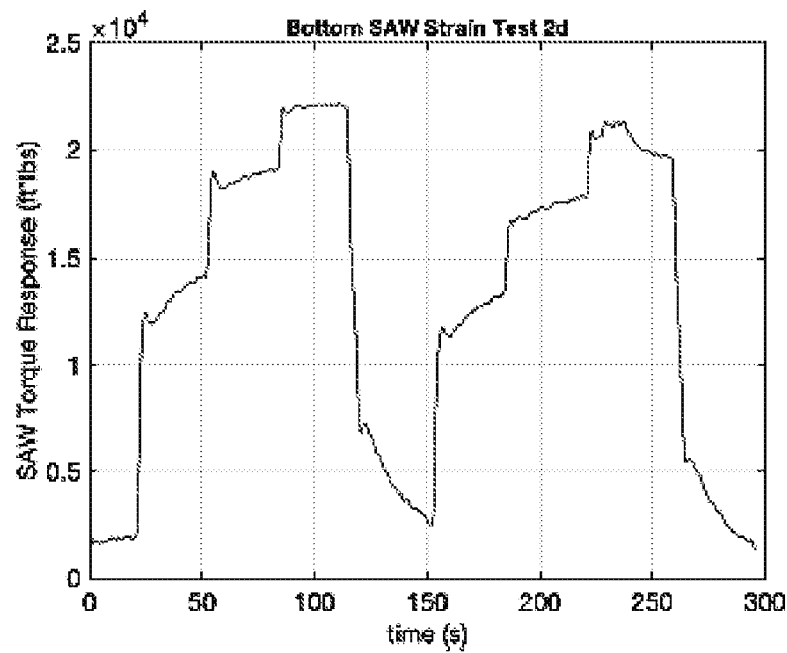
FIG. 37b is a graph showing readings taken from the wireless SAW sensors during the pole tension testing load sequence performed in Example 7.
Figure 38A:
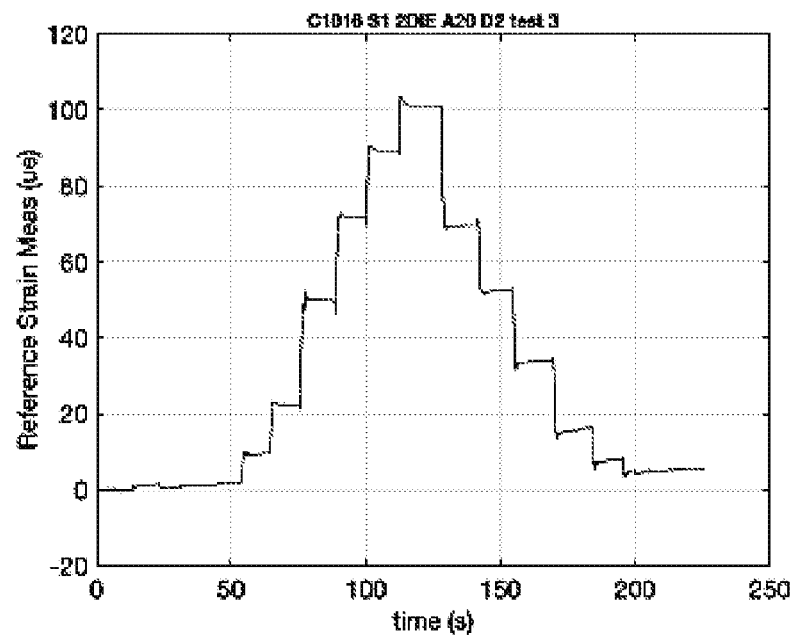
FIG. 38a is a graph showing strain as measured with the wired strain sensor of Example 7.
Figure 38B:
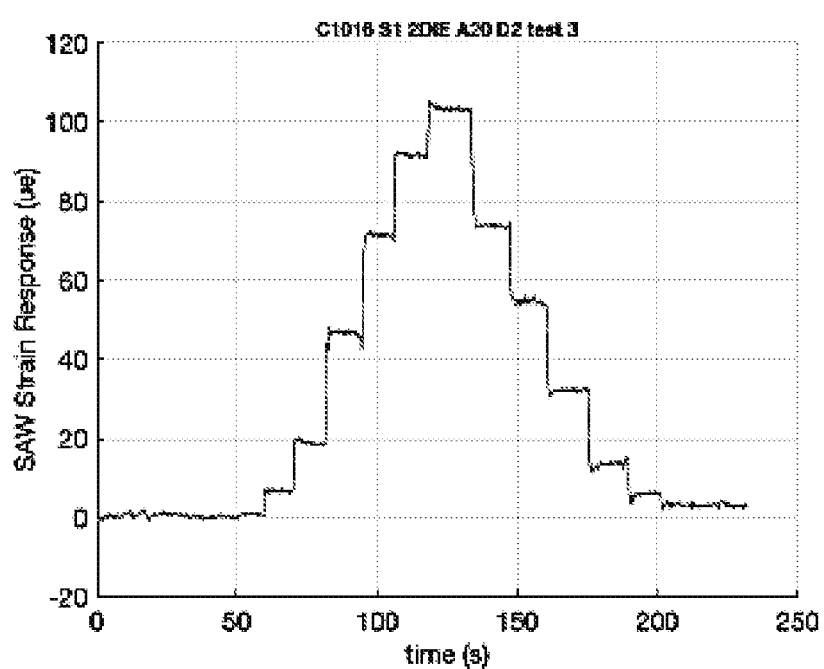
FIG. 38b is a graph showing strain as measured with the wireless SAW sensors of Example 7.

FIGS. 37a and 37b are characteristic of the data collected from the SAW strain sensors mounted on the pole. FIGS. 37a and 37b show a comparison of (a) conventional wired strain sensors from BDI and (b) SAW wireless strain sensors during a typical pole tension testing load sequence. The SAW strain sensors exhibited significant relaxation effects which may be related to the adhesives used in die mounting. These devices responded to an increase in applied load with an initial step that was fast (as do the BDI wired strain sensors), but the SAW sensors did not jump to the correct strain level immediately. Rather, they jumped to a strain level closer to their prior value of strain, and then over a period of tens of seconds they 'relaxed' into a strain reading that was more correct. Data using a ceramic SAW package (rather than metal-shim-base) is shown in FIGS. 38a and 38b. FIG. 38a shows the strain as measured with a reference wired strain gauge, and FIG. 38b shows measurements from the SAW sensor. There was good agreement in the sensor responses, even in the time-dependent fine structure of the responses. Impact testing prior to the FAT caused the SAW substrate to fracture in the region of the die that was rigidly epoxied to the metal package base. The likely cause was the direct transmission of a mechanical shock wave in the pole into the die, through the close mechanical coupling provided between the pole and the die by the mounted metal base and die attached epoxy.

Example 8: Dynamic Pole Loading—External Impact

The purpose of this test was to demonstrate the system's ability to detect external impacts, such as vehicle collisions or other environmental factors. The handle of a 16 pound sledgehammer was mounted within a square steel tube to extend the handle length, and the steel tube was mounted on an axle near its end around which the handle could rotate freely. A steel crossbar on the strain test rig was positioned to prevent the hammer from overextending during testing. An angular reference was mounted on the rig to enable repeated impact tests to be conducted by raising the hammer handle to a selected angle and releasing it. Repeated tests were performed where the hammer was sequentially dropped from angular positions of 20°, 30°, and 45°.

Figure 39A:
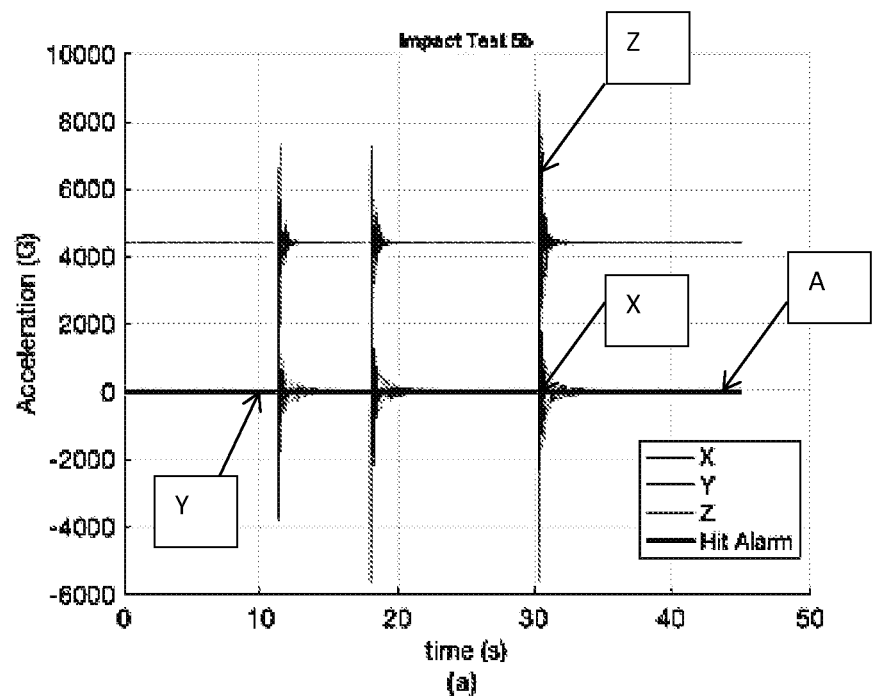
FIG. 39a is a graph showing time domain data gathered from an accelerometer in an inertial measurement unit in a pole-mounted data aggregator of Example 8.
Figure 39B:
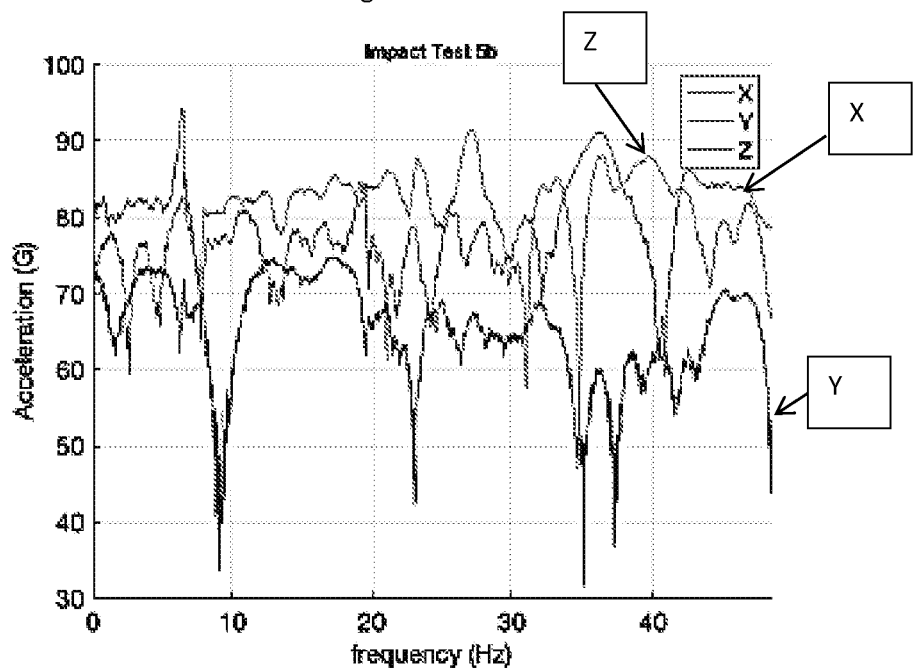
FIG. 39b is a graph showing frequency domain responses read by the accelerometer of Example 8.

FIGS. 39a and 39b show data from a test sequence. In FIGS. 39a and 39b, X-axis movement is labeled X, Y-axis movement is labeled Y, Z-axis movement is labeled Z and Hit Alarm is labeled A. FIG. 39a shows the time domain data gathered from the accelerometer in the inertial measurement unit in the pole-mounted data aggregator. There is significant overlap between X, Y and the Hit Alarm. The IMU detected a sudden response with each of the three impacts, where the vibration amplitude increased with increasing impact intensity and the pole vibrations rang down with time after the impact. These measurements could be used to produce a measure of the nature of an impact on the pole. Fourier transforming the data from the time domain response yields the frequency domain responses shown in the FIG. 39b. For both plots the responses are measured by each of the three axes in the 3-axis accelerometer within the IMU. In the test setup used, where the pole was lying horizontal, the "Y" axis of the accelerometer was along the length of the pole, the "Z" axis was pointing upward, away from the floor, and the "X" axis was pointing to the side. Both the X and Y readings were zero prior to any impacts, while the Z reading was ~4,200 "G", an arbitrary unit of measure based on the resolution of signal digitization in the IMU that corresponded to the specific force counteracting the force of gravity on a test mass within the IMU, which was one "g". Impacts of greater than 6 g triggered an impact alarm.

The hammer impacts all hit in a location that applied the impact to the side of the pole, along the X axis. The largest response was seen in FIG. 39(a) along the X axis, although a significant vibration along the Y axis was also observed. There was almost no response in the Z direction (along the pole length). The frequency response observed along each axis is shown in FIG. 39(b). The X axis showed a fairly narrowband spike at about 6 Hz, which was not seen in the responses along the other two axes. This type of feature could be useful to develop signatures for impacts of various kinds, or to differentiate an impact from other conditions or events (such as a pole blowing in the wind or a line break).

Example 9: Dynamic Pole Loading—Vibration Detection

The purpose of this test was to demonstrate the system's ability to detect external vibrations affecting the pole, such as those that might be caused by earthquakes or strong wind storms. A VIBCO SCR-1000 electric industrial vibrator with adjustable speed and force was mounted firmly on the pole and the vibration excitation level (corresponding to power and frequency) was varied to evaluate the effect on the pole of being exposed to different (approximated) environmental conditions. IMU data was collected as vibration excitation was varied, and the pole was observed to go through a resonance as the excitation was varied from high to low or vice versa. A vibration alarm threshold was set for a change of 2,500 G (in arbitrary IMU response units) from the baseline (still) acceleration level for each axis.

Figure 40A:
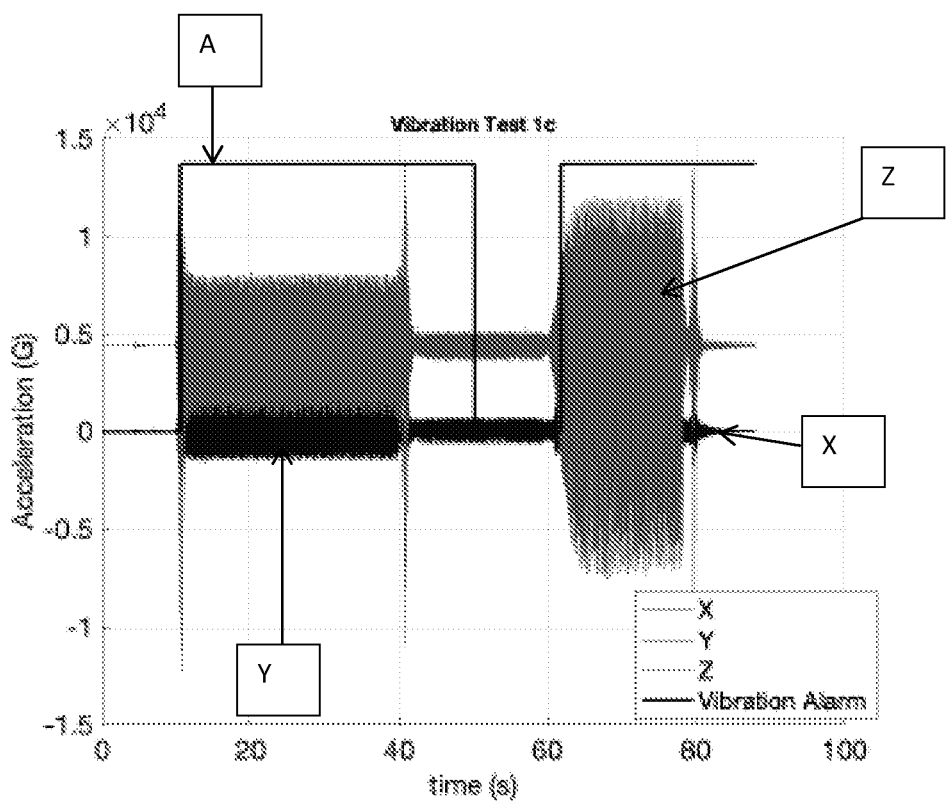
FIG. 40a is graph showing time domain vibration data from an inertia measurement unit (IMU) accelerometer of Example 9.
Figure 40B:
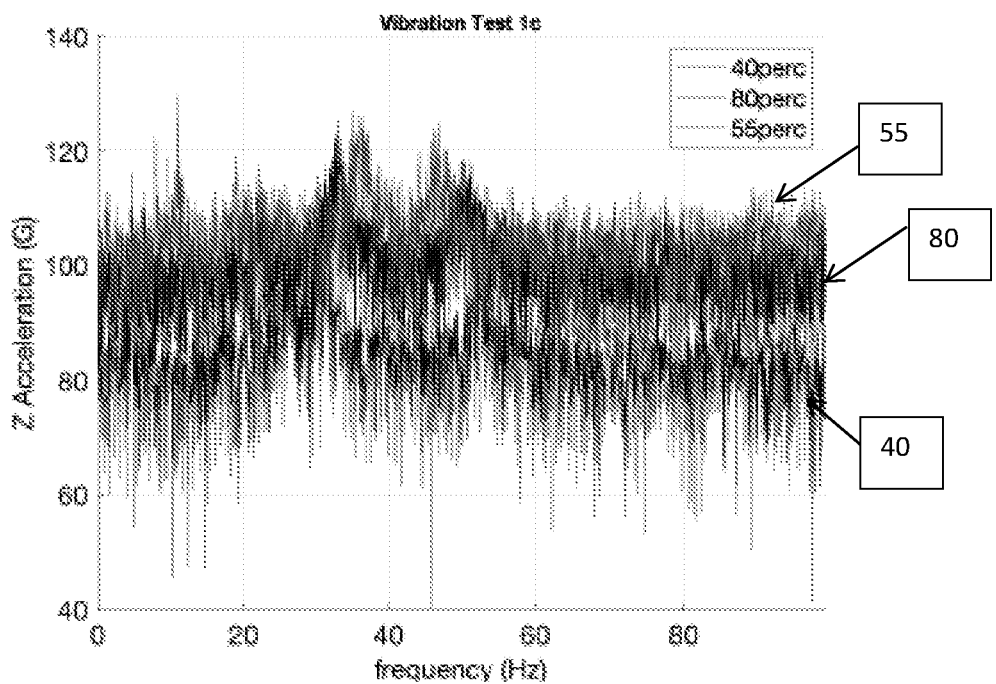
FIG. 40b is a graph showing accelerometer data from vibration tests of Example 9 with excitation sequentially set to 80%, then 40%, and 55%.

FIGS. 40a and 40b show accelerometer data from vibration tests with the excitation sequentially set to 80%, then 40%, and 55%. FIG. 40(a) shows time domain vibration data from the IMU accelerometer while FIG. 40(b) shows the corresponding frequency domain responses. In FIG. 40b there is significant overlap between 55% and 80%. Vibration alarms were triggered for both 80% and 55% levels. The alarm latch timed out at 40% and the alarm turned off. Excitation of the pole at a harmonic of the pole's natural resonance frequency caused much greater vibration in the pole than excitation with the same amount of energy (or even more) applied at other frequencies. There were large but well-controlled vibrations at 80% excitation levels, low and well controlled vibrations at 40%, and large, more widely varying acceleration due to vibrations with the excitation set to 55%. Spikes in vibration occurred at the start of this test as the applied excitation ramped from zero through a harmonic around 55% to reach 80%, and again when the excitation ramped down from 80% to 40%.

The frequency responses for the Z axis of the accelerometer for all three excitation levels are shown in FIG. 40(b). There were two distinct spectral peaks in the frequency response that varied based on the level of vibration. At 55%, where vibrations were strongest there were peaks at ~35 Hz and at ~46 Hz. At 80% excitation, where vibrations were somewhat lower, the peaks shifted to ~32.5 Hz and ~49 Hz. At the lower vibration level observed with the excitation set to 40%, the peaks separated further, to ~30 Hz and ~52 Hz. There was a spectral component near 10 Hz that increased in size as vibration levels increased.

Example 10: Dynamic Pole Loading-Damage Assessment

This test was intended to demonstrate the system's ability to detect whether or not the pole had sustained damage. This damage could be due a variety of external factors. To simulate one such condition, the pole was placed under load. Then a vibrator was turned on, and the load was removed suddenly (to simulate line break), triggering multiple alarms.

Figure 41A:
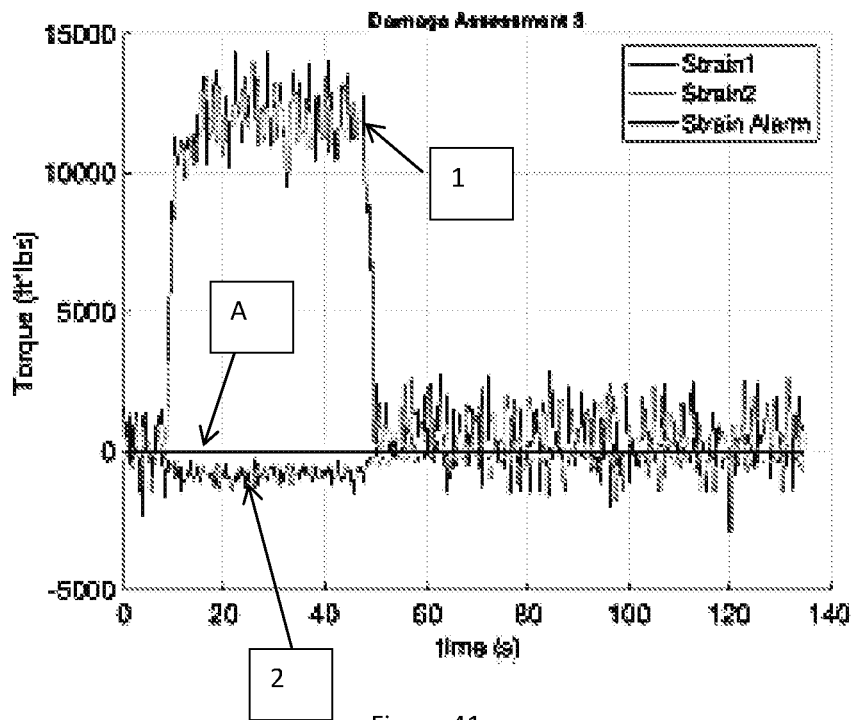
FIG. 41a is a graph showing torque data from two wired strain sensors of Example 10.
Figure 41B:
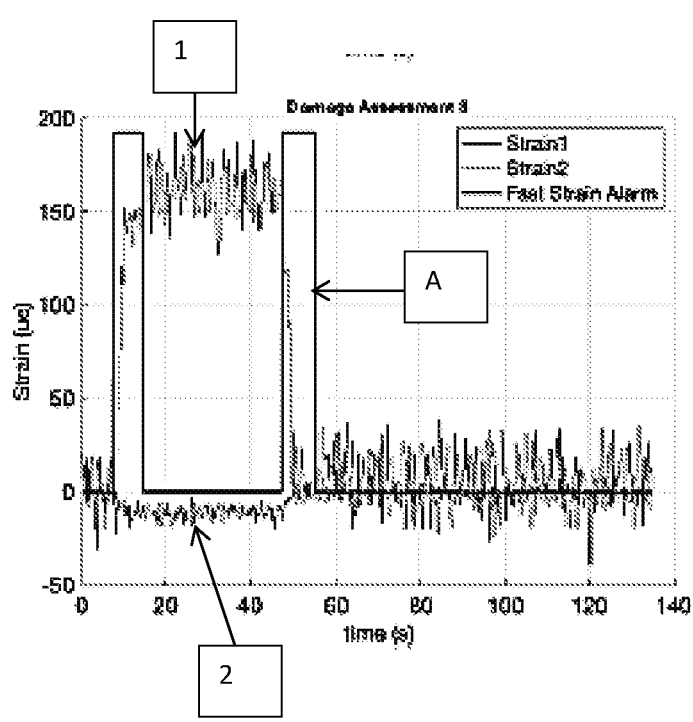
FIG. 41b is a graph showing strain data from the two wired strain sensors of Example 10.
Figure 41C:
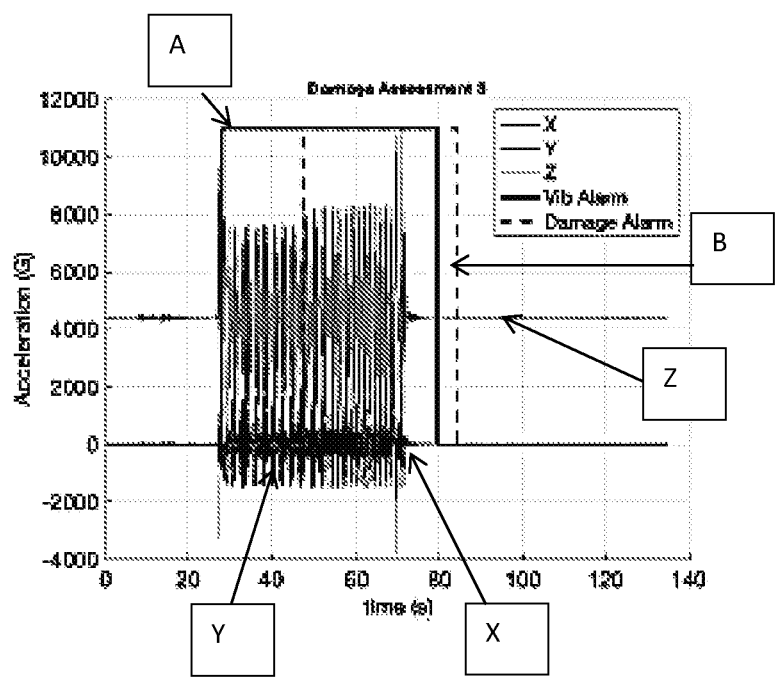
FIG. 41c is a graph showing accelerometer readings taken during Example 10.

FIGS. 41a, 41b, and 41c show plots of data collected from strain and vibration sensors during one damage assessment test sequence. FIG. 41(a) shows the data from the two strain sensors (Strain1 labeled 1 and Strain2 labeled 2), with a plot of the strain alarm status superimposed, demonstrating that the strain never exceeded a level that would trigger the strain alarm. A second alarm, call the 'Fast Strain' alarm, was used that triggered based on the rate of change of strain. In FIG. 41(b) the fast strain alarm was triggered both while the strain was being applied and while it was removed. FIG. 41(c) shows the vibration response, which triggered a vibration alarm. The occurrence of a fast strain alarm, together with a vibration alarm, triggered a 'Damage Alarm', shown by the dashed line in FIG. 41(c). In FIG. 41(c) the Vibration Alarm is labeled A and the Damage Alarm is labeled B.

Example 11: Dynamic Pole Loading—Wire Break

This test demonstrated the system's ability to detect a sudden loss of pole loading such as a wire break/line down event. The test apparatus shown in FIG. 29 was used. The test sequence involved applying a load to the pole using the hoist, securing the loaded pole with a quick-release secondary load support system comprised of block and tackle with a cam cleat to maintain pole loading, reducing the hoist loading to zero (leaving the pole load supported by the block and tackle system), then pulling the line out of the cam cleat to suddenly release the load, simulating a wire break event.

Figure 42A:
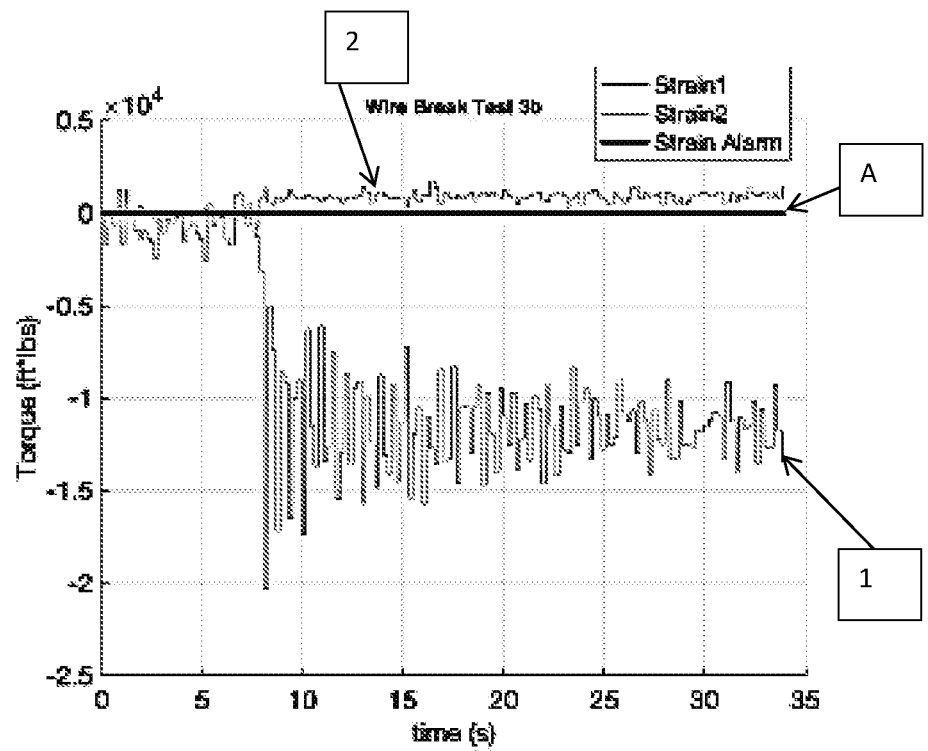
FIG. 42a is graph showing a response to a line break test as detected by the wired strain sensors of Example 11.
Figure 42B:
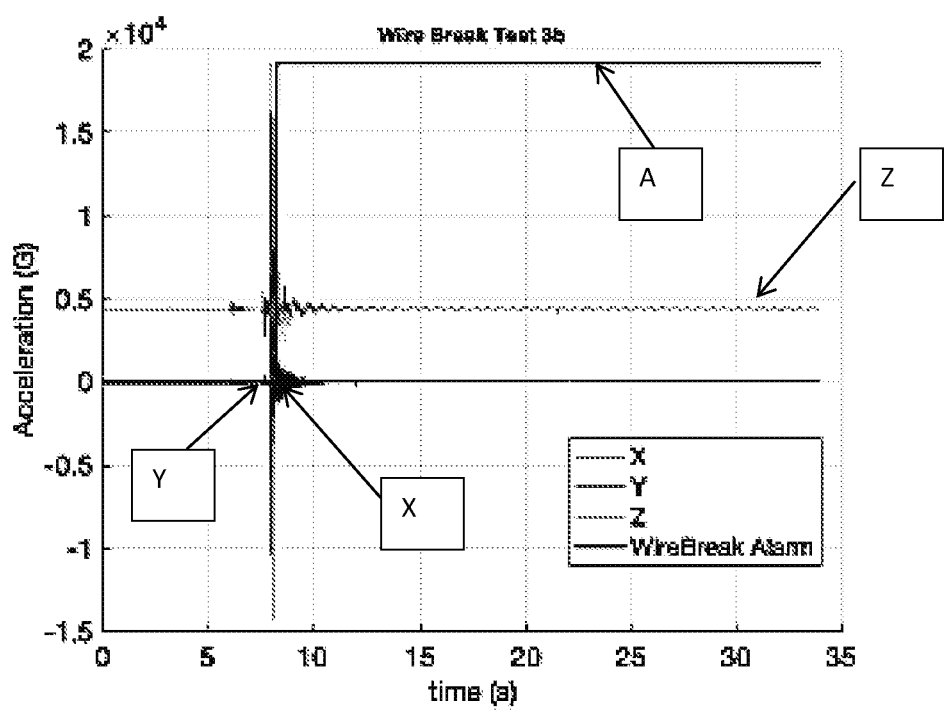
FIG. 42b is a graph showing a response to a line break test as detected by the wireless SAW sensors of Example 11.
Figure 43:
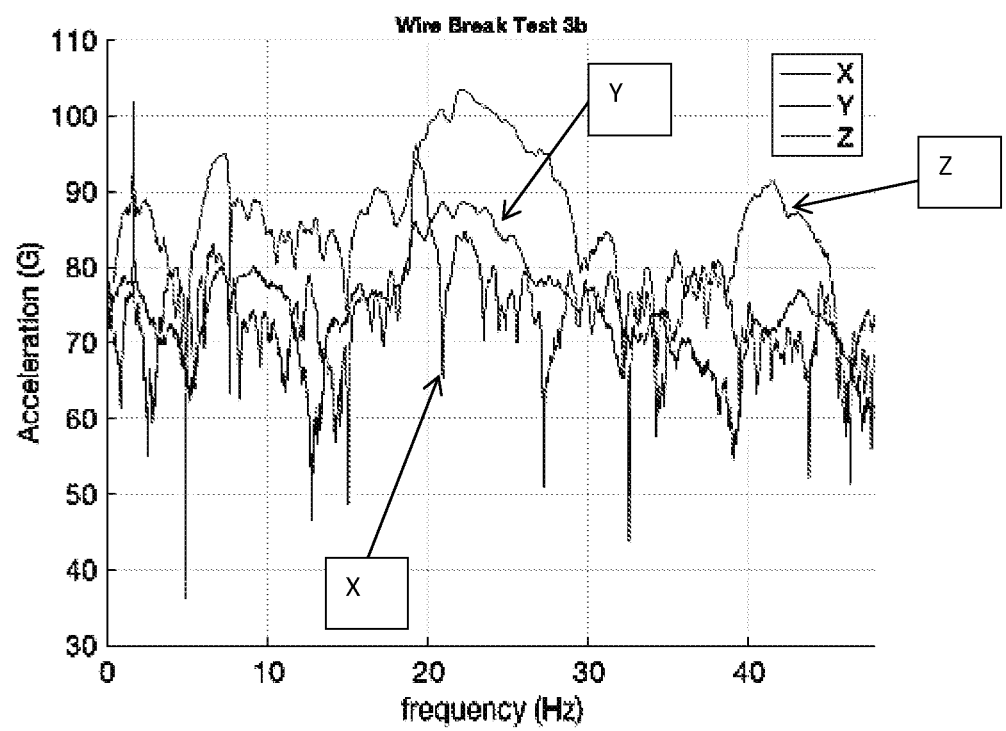
FIG. 43 is a graph showing the frequency response corresponding to the vibration sensor data of FIGS. 42a and 42b of Example 11.

FIGS. 42a and 42b show a response to a line break test, as detected by strain sensors (FIG. 42a) and vibration sensors (FIG. 42b). In FIG. 42a the strain sensors are labeled 1 and 2 and the alarm is labeled A. The strain sensors detected a sudden change in pole loading when the wire break occurred, and the vibration sensors recorded a transient that triggered the wire break alarm. In FIG. 42b the X, Y and Z axis are labeled X, Y and Z, respectively, and the Wire Break Alarm is labeled A. FIG. 43 shows the frequency response corresponding to the vibration sensor data of FIGS. 42a and 42b. Some features that appeared in multiple line break tests for this pole included a Z-axis frequency response with a sharp narrowband spike at ~2 Hz, and a broader passband response at ~22 Hz; and a X-axis response with a sharp passband at ~18 Hz. These response characteristics could form the basis for generation of sensor response signatures that would allow the system to recognize specific line break events.

Example 12: Dynamic Pole Loading—Tilt Test

Figure 44:
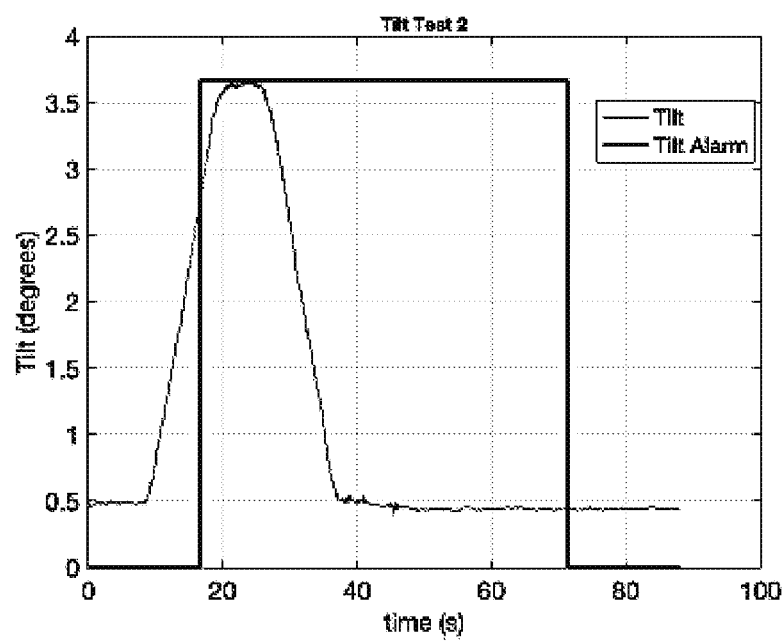
FIG. 44 is a graph showing tilt sensor response for a pole tilt test of Example 12.

The purpose of this test was to demonstrate the system's capability to detect changes in pole tilt. The test apparatus shown in FIG. 29 was used. The straps connecting the pole to the concrete floor were released to allow the gantry crane to elevate one end of the pole, and change in pole tilt was measured by the IMU. The angular range over which the pole could be tilted by the gantry crane was limited, hence the tilt alarm was set to alarm when the pole tilt changed by 2.75 degrees. FIG. 44 shows the tilt sensor response for a typical pole tilt test.

Summary of Results

This factory acceptance test demonstrated the laboratory system's capability to detect and produce local and remote alarms in response to fire, pole loading, pole vibration, impacts exceeding defined levels, simulated pole damage, simulated wire breaks, and changes in pole tilt. Alarms were triggered at predefined levels for each pole condition, and were displayed locally on a laptop and remotely on a cloud-based interface. Features in the time and frequency domain responses of sensors that were common to events (such as line break, impact, etc.) were observed in laboratory testing.

The tests conducted conclusively showed the system's ability to detect the following conditions and to trigger both local and remote alarms if certain conditions were met were demonstrated: (i) fire detection—using both infrared (IR) and temperature sensors; (ii) dynamic pole loading—under both tension and external impact conditions; (iii) vibration; (iv) pole tilt; and (v) combinations of the above factors relevant to system operation in situations involving specific test cases. Based on the FAT results, is it clear that the system will be a useful tool to enhance real-time visibility into pole conditions and to detect fires in the power company's evolving smart grid.

Advantages of the present invention:

The sensing system can be designed so that it can be added to either new hybrid poles or existing poles (wood or all-composite) in the field as needed.

The sensing system will improve asset condition monitoring, and use of the sensing system will allow the poles to have a longer pole service life than wood poles. Also, the system will improve storm damage assessment and shorten restoration response time because the location of fallen or damaged poles will not require physical inspection; it will be automatically identified.

The sensing system can also help identify any abrupt change in pole loading (wire tension) for the operator to detect a wire down scenario, and quickly de-energize the conductor to reduce risk of ignition from downed wire improving public safety and reducing risk to property damage.

Although the present invention has been described in considerable detail with reference to certain preferred embodiments, other embodiments are possible. For example, although the invention has been described principally with regard to power systems, features of the invention can be used with other types of poles such as telephone poles and lighting poles. Therefore, the scope of the appended claims should not be limited to the description of preferred embodiments contained in this disclosure.

What is claimed is:

1. An energy transmission system comprising:
   (a) a power pole having a longitudinal axis and comprising:
      i) a hollow lower portion having an interior surface;
      ii) an upper portion coupled to the lower portion; and
      iii) a cross arm coupled to the upper portion;
   (b) at least one power wire supported by the cross arm of the pole;
   (c) a sensing system coupled to the pole for monitoring pole temperature, dynamic pole loading, external impact on the pole, vibration of the pole, and a power wire that is downed, the sensing system comprising:
      i) a first dynamic pole loading sensor coupled to the interior surface of the hollow lower portion of the pole above ground level but not more than 10 feet above ground level, the first dynamic pole loading sensor having a longitudinal axis parallel to the longitudinal axis of the pole;
      ii) a second dynamic pole loading sensor coupled to the interior surface of the hollow lower portion of the pole above ground level but not more than 10 feet above ground level, the second dynamic pole loading sensor having a longitudinal axis perpendicular to the longitudinal axis of the pole; and
      iii) at least one three-dimensional accelerometer coupled to the interior surface of the hollow lower portion of the pole;
   (d) at least one line sensor coupled to the at least one power wire for sensing transmission of electricity through the power wire; and
   (e) at least one powered data receiver in communication with the first and second dynamic pole loading sensors, the at least one accelerometer, and the at least one line sensor, and in external communication with a control and data acquisition system.

2. The energy transmission system of claim 1, wherein the first and second dynamic pole loading sensors monitor dynamic pole loading, temperature of the pole and power wires that are downed and the at least one accelerometer monitors vibration of the pole, external impact on the pole, tilt of the pole, and power wires that are downed.

3. The energy transmission system of claim 1, wherein the first and second dynamic pole loading sensors are coupled to the pole between 6 and 10 feet above ground level.

4. An energy transmission system comprising:
   (a) a pole comprising:
      i) a lower portion; and
      ii) an upper portion coupled to the lower portion;
   (b) at least one wire supported by the upper portion of the pole;
   (c) a sensing system coupled to the lower portion of the pole comprising:
      i) at least one dynamic pole loading sensor coupled to the lower portion above ground level but not more than 10 feet above ground level; and
      ii) at least one three-dimensional accelerometer;
   (d) at least one line sensor coupled to the at least one wire; and
   (e) at least one powered data receiver in communication with the at least one dynamic pole loading sensor, the at least one accelerometer, and the at least one line sensor.

5. The energy transmission system of claim 4, wherein the at least one dynamic pole loading sensor monitors dynamic pole loading, temperature of the pole and wires that are downed and the at least one accelerometer monitors vibration of the pole, external impact on the pole, tilt of the pole, and wires that are downed.

6. The energy transmission system of claim 4, wherein the at least one dynamic pole loading sensor is a wireless surface acoustic wave sensor.

7. The energy transmission system of claim 4, wherein the at least one dynamic pole loading sensor is coupled to the pole between 6 and 10 feet above ground level.

8. The energy transmission system of claim 4, wherein the at least one dynamic pole loading sensor puts forth an alarm signal when a measured load is determined to be greater than a predetermined set value.

9. The energy transmission system of claim 7, wherein the pole is a power pole and the at least one wire is a power wire.

10. An energy transmission system comprising:
   (a) a pole having a longitudinal axis and comprising:
      i) a lower portion; and
      ii) an upper portion coupled to the lower portion;

(b) at least one wire supported by the upper portion of the pole;
(c) a sensing system coupled to the lower portion of the pole comprising:
  i) a first dynamic pole loading sensor coupled to the lower portion of the pole, the first dynamic pole loading sensor having a longitudinal axis parallel to the longitudinal axis of the pole;
  ii) a second dynamic pole loading sensor coupled to the lower portion of the pole, the second dynamic pole loading sensor having a longitudinal axis perpendicular to the longitudinal axis of the pole; and
  iii) at least one three-dimensional accelerometer;
(d) at least one line sensor coupled to the at least one wire; and
(e) at least one powered data receiver in communication with the first and second dynamic pole loading sensors, the at least one accelerometer, and the at least one line sensor.

11. The energy transmission system of claim 10, wherein the dynamic pole loading sensors monitor dynamic pole loading, temperature of the pole and wires that are downed.

12. The energy transmission system of claim 10, wherein the at least one accelerometer monitors vibration of the pole, external impact on the pole, tilt of the pole, and wires that are downed.

13. The energy transmission system of claim 10, wherein the first and second dynamic pole loading sensors are wireless surface acoustic wave sensors.

14. The energy transmission system of claim 10, wherein the first and second dynamic pole loading sensors put forth an alarm signal when a measured load is determined to be greater than a predetermined set value.

15. The energy transmission system of claim 10, wherein the pole is a power pole and the at least one wire is a power wire.

16. An energy transmission system comprising:
(a) a pole comprising:
  i) a lower portion; and
  ii) an upper portion coupled to the lower portion;
(b) at least one wire supported by the upper portion of the pole;
(c) a sensing system coupled to the pole for monitoring pole temperature, dynamic pole loading, external impact on the pole, vibration of the pole, and a wire that is downed, the sensing system comprising:
  i) at least one dynamic pole loading sensor; and
  ii) a first three-dimensional accelerometer;
(d) at least one line sensor coupled to the at least one wire; and
(e) at least one powered data receiver in communication with the at least one dynamic pole loading sensor, the first accelerometer, and the at least one line sensor.

17. The energy transmission system of claim 16, wherein the at least one dynamic pole loading sensor monitors dynamic pole loading, temperature of the pole and wires that are downed.

18. The energy transmission system of claim 16, wherein the at least one accelerometer monitors vibration of the pole, external impact on the pole, tilt of the pole, and wires that are downed.

19. The energy transmission system of claim 16, wherein the at least one dynamic pole loading sensor is a wireless surface acoustic wave sensor.

20. The energy transmission system of claim 16, wherein the at least one dynamic pole loading sensor is coupled to the pole between 6 and 10 feet above ground level.

21. The energy transmission system of claim 16, wherein the at least one dynamic pole loading sensor puts forth an alarm signal when a measured load is determined to be greater than a predetermined set value.

22. The energy transmission system of claim 16, wherein the pole is a power pole and the at least one wire is a power wire.

* * * * *